United States Patent
Ma et al.

(10) Patent No.: US 11,721,708 B2
(45) Date of Patent: *Aug. 8, 2023

(54) SCALABLE-PIXEL-SIZE IMAGE SENSOR

(71) Applicant: Gigajot Technology, Inc., Pasadena, CA (US)

(72) Inventors: Jiaju Ma, Monrovia, CA (US); Michael Guidash, The Villages, FL (US)

(73) Assignee: Gigajot Technologies, Inc., Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/851,461

(22) Filed: Jun. 28, 2022

(65) Prior Publication Data

US 2022/0328544 A1 Oct. 13, 2022

Related U.S. Application Data

(63) Continuation of application No. 17/401,170, filed on Aug. 12, 2021, which is a continuation of application
(Continued)

(51) Int. Cl.
*H04N 25/65* (2023.01)
*H04N 25/75* (2023.01)
(Continued)

(52) U.S. Cl.
CPC .. *H01L 27/14612* (2013.01); *H01L 27/14621* (2013.01); *H01L 27/14627* (2013.01);
(Continued)

(58) Field of Classification Search
CPC ......... H04N 5/347; H04N 25/65; H04N 25/75
See application file for complete search history.

(56) References Cited

U.S. PATENT DOCUMENTS 6,252,217 B1 * 6/2001 Pyyhtia ............... H04N 5/3454
348/E3.02
6,714,239 B2  3/2004 Guidash
(Continued)

FOREIGN PATENT DOCUMENTS

EP  3487166 A1  5/2019

OTHER PUBLICATIONS

International Bureau of World Intellectual Property Organization (WIPO), International Preliminary Report on Patentability (IPRP) in International Application No. PCT/US2020/061664, dated Jun. 2, 2022, 8 pages.
(Continued)

*Primary Examiner* — Thanh Luu
(74) *Attorney, Agent, or Firm* — Robert C. Kowert; Kowert, Hood, Munyon, Rankin & Goetzel, P.C.

(57) ABSTRACT

A pixel array within an integrated-circuit image sensor includes four sets of photodetection elements disposed in respective pixel-array regions having a shared corner, four readout circuits each coupled to a respective one of the four sets of photodetection elements, a reset node, a reset transistor, and binning transistors. Each of the four readout circuits has a floating diffusion node, a first transfer gate coupled between the floating diffusion node and a constituent photodetection element of the respective one of the four sets of photodetection elements, and an amplifier transistor having a gate terminal coupled to the floating diffusion node. The reset transistor is coupled between the reset node and a reset-voltage supply, and each one of the binning transistors is coupled between the reset node and the floating diffusion node of a respective one of the readout circuits.

26 Claims, 11 Drawing Sheets

Related U.S. Application Data

No. 17/100,696, filed on Nov. 20, 2020, now Pat. No. 11,114,482.

(60) Provisional application No. 62/938,203, filed on Nov. 20, 2019.

(51) Int. Cl.
  *H01L 27/146*    (2006.01)
  *H01L 27/148*    (2006.01)

(52) U.S. Cl.
  CPC ....... *H01L 27/14831* (2013.01); *H04N 25/65* (2023.01); *H04N 25/75* (2023.01)

(56) References Cited

U.S. PATENT DOCUMENTS

| | | | |
|---|---|---|---|
| 7,075,049 B2 | 7/2006 | Rhodes et al. | |
| 7,705,900 B2 | 4/2010 | Guidash | |
| 7,745,779 B2 | 6/2010 | Conners | |
| 7,830,435 B2 | 11/2010 | Guidash | |
| 8,159,585 B2 | 4/2012 | Parks et al. | |
| 9,888,198 B2 | 2/2018 | Mauritzson et al. | |
| 10,535,690 B1 | 1/2020 | Tower et al. | |
| 2004/0165080 A1* | 8/2004 | Burks | H04N 5/347 348/222.1 |
| 2008/0062290 A1 | 3/2008 | Lahav et al. | |
| 2008/0239125 A1 | 10/2008 | Verdant | |
| 2010/0182465 A1 | 7/2010 | Okita | |
| 2012/0312964 A1 | 12/2012 | Yamashita et al. | |
| 2014/0078368 A1 | 3/2014 | Komori et al. | |
| 2015/0201140 A1 | 7/2015 | Solhusvik et al. | |
| 2018/0209842 A1 | 7/2018 | Komori et al. | |
| 2019/0386057 A1 | 12/2019 | Wang et al. | |
| 2020/0027914 A1* | 1/2020 | Lee | H01L 27/1463 |
| 2020/0053309 A1 | 2/2020 | Takatsuka et al. | |
| 2020/0322553 A1* | 10/2020 | Shim | H04N 5/37457 |

OTHER PUBLICATIONS

World Intellectual Property Organization (WIPO), International Search Report and Written Opinion of International Search Authority (European Patent Office) in International Application No. PCT/US2020/061664, purported online posting date Feb. 8, 2021, 10 pages.

* cited by examiner

FIG. 3 2x Pixel-Pitch 1CG Readout

FIG. 4 4x Pixel-Pitch 1CG Readout

FIG. 2 1x Pixel-Pitch 1CG Readout

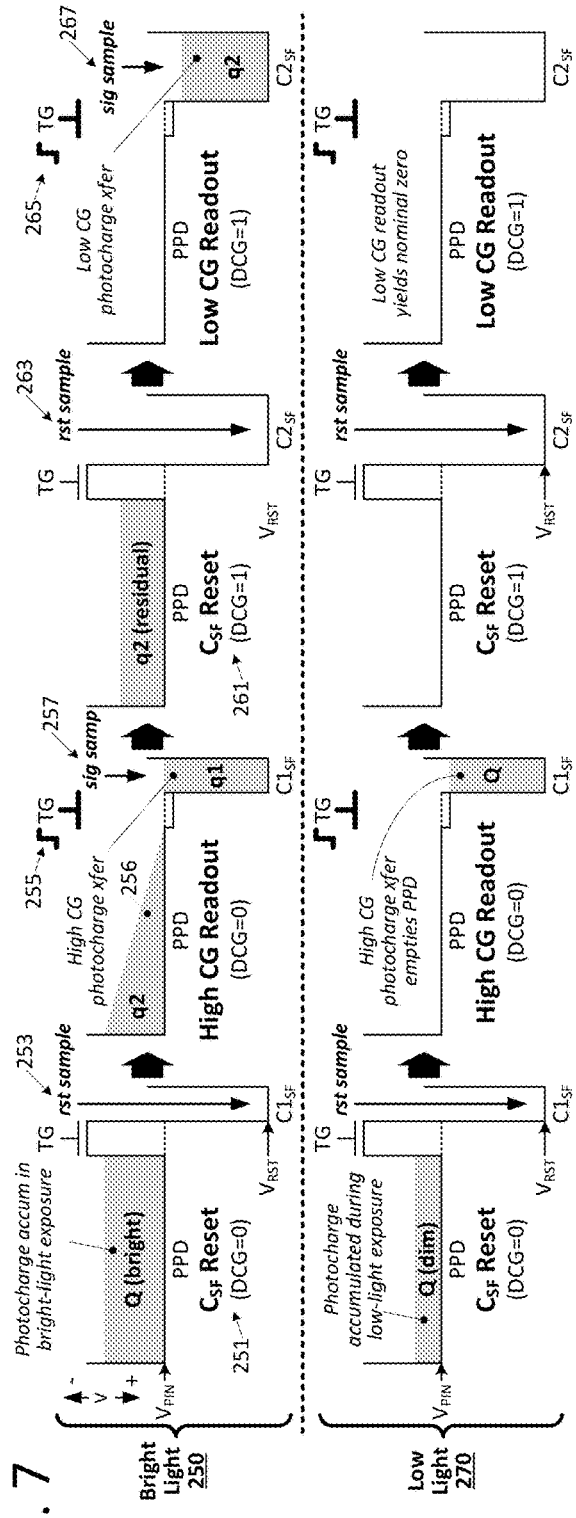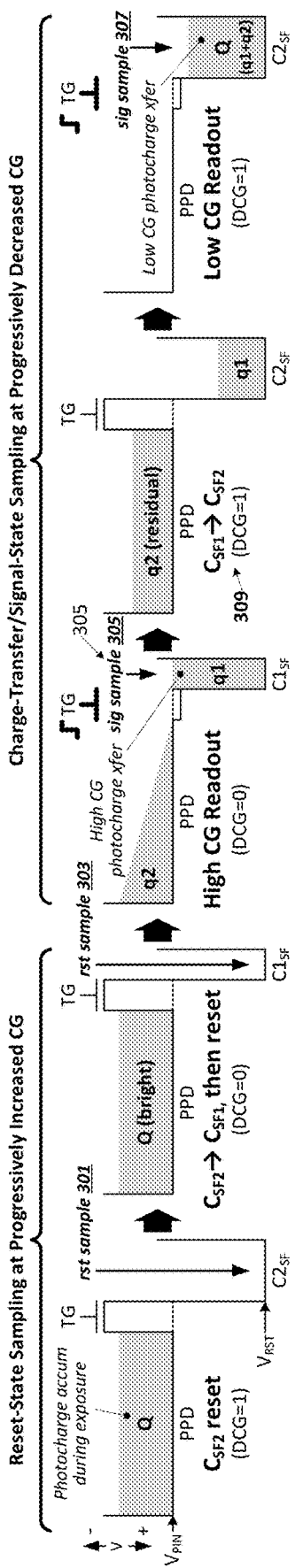
FIG. 7
FIG. 8

2x Pixel-Pitch
Dual-CG Readout

2x Pixel-Pitch
Triple-CG Readout

2x Pixel-Pitch
Triple-CG Readout,
Cumulative Xfer

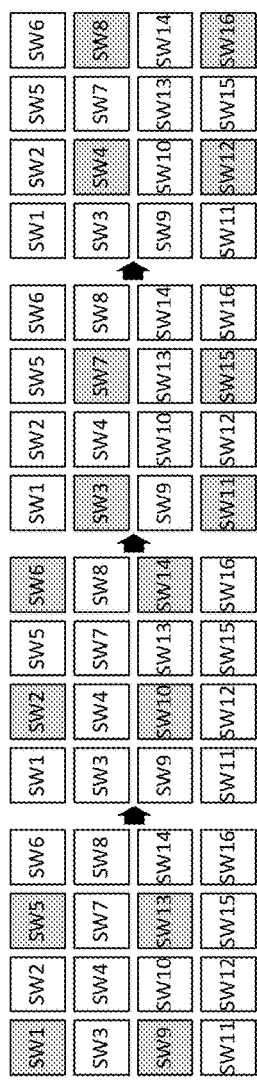
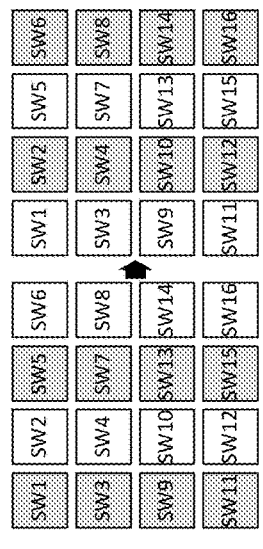
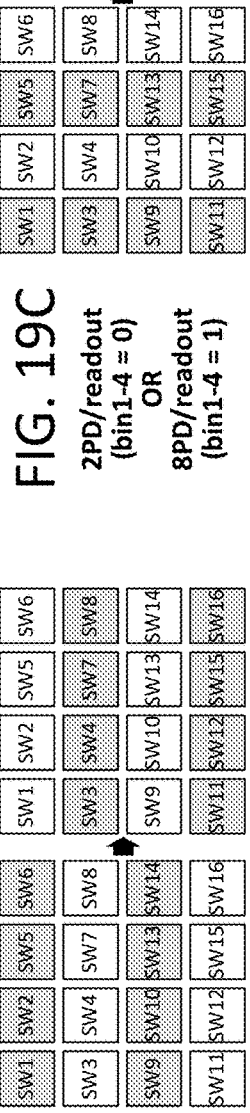
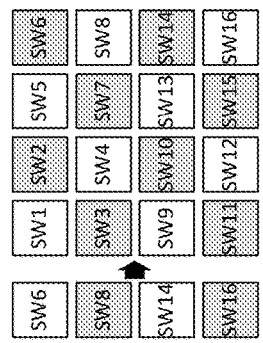
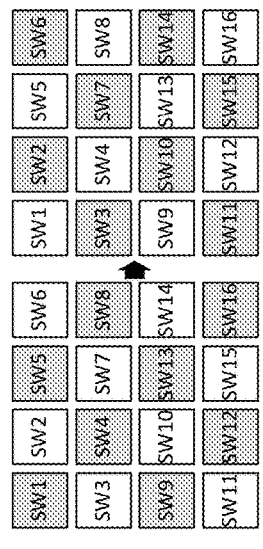
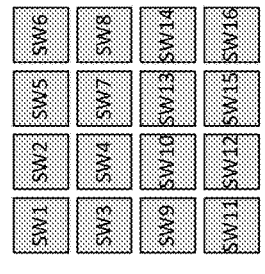
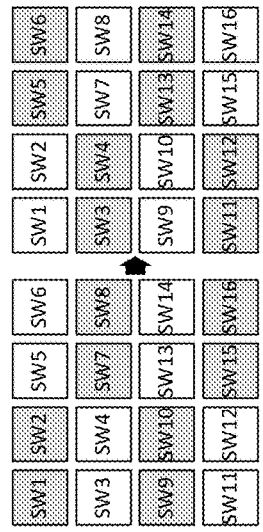
FIG. 19A
1PD/readout
FIG. 19B
2PD/readout
(bin1-4 = 0)
OR
8PD/readout
(bin1-4 = 1)
FIG. 19C
2PD/readout
(bin1-4 = 0)
OR
8PD/readout
(bin1-4 = 1)
FIG. 19D
2PD/readout
(bin1-4 = 0)
OR
8PD/readout
(bin1-4 = 1)
FIG. 19E
2PD/readout
(bin1-4 = 0)
OR
8PD/readout
(bin1-4 = 1)
FIG. 19F
3:1PD/readout
(bin1-4 = 0)
OR
12:4PD/readout
(bin1-4 = 1)
FIG. 19G
4PD/readout
(bin1-4 = 0)
OR
16PD/readout
(bin1-4 = 1)

SCALABLE-PIXEL-SIZE IMAGE SENSOR

CROSS-REFERENCE TO RELATED APPLICATIONS

This application is a continuation of U.S. application Ser. No. 17/401,170 filed Aug. 12, 2021, which is a continuation of U.S. application Ser. No. 17/100,696 filed Nov. 20, 2020 (U.S. Pat. No. 11,114,482), which claims the benefit of U.S. provisional application No. 62/938,203 filed Nov. 20, 2019. Each of the foregoing patent applications is hereby incorporated by reference.

TECHNICAL FIELD

The disclosure herein relates to integrated-circuit image sensors.

DRAWINGS

The various embodiments disclosed herein are illustrated by way of example, and not by way of limitation, in the figures of the accompanying drawings and in which like reference numerals refer to similar elements and in which:

FIG. 2 illustrates an exemplary sequence of control signals generated by the FIG. 1 row controller to enable post-exposure correlated-double-sample (CDS) readout with minimal pixel size and maximum conversion gain;

FIG. 3 illustrates an exemplary sequence of control signals generated by the FIG. 1 row controller to enable post-exposure CDS readout at intermediate pixel size and maximum conversion gain;

FIG. 4 illustrates an exemplary control signal sequence that enables post-exposure CDS readout at maximum pixel size and maximum ×4-pitch conversion gain.

Figure 1:
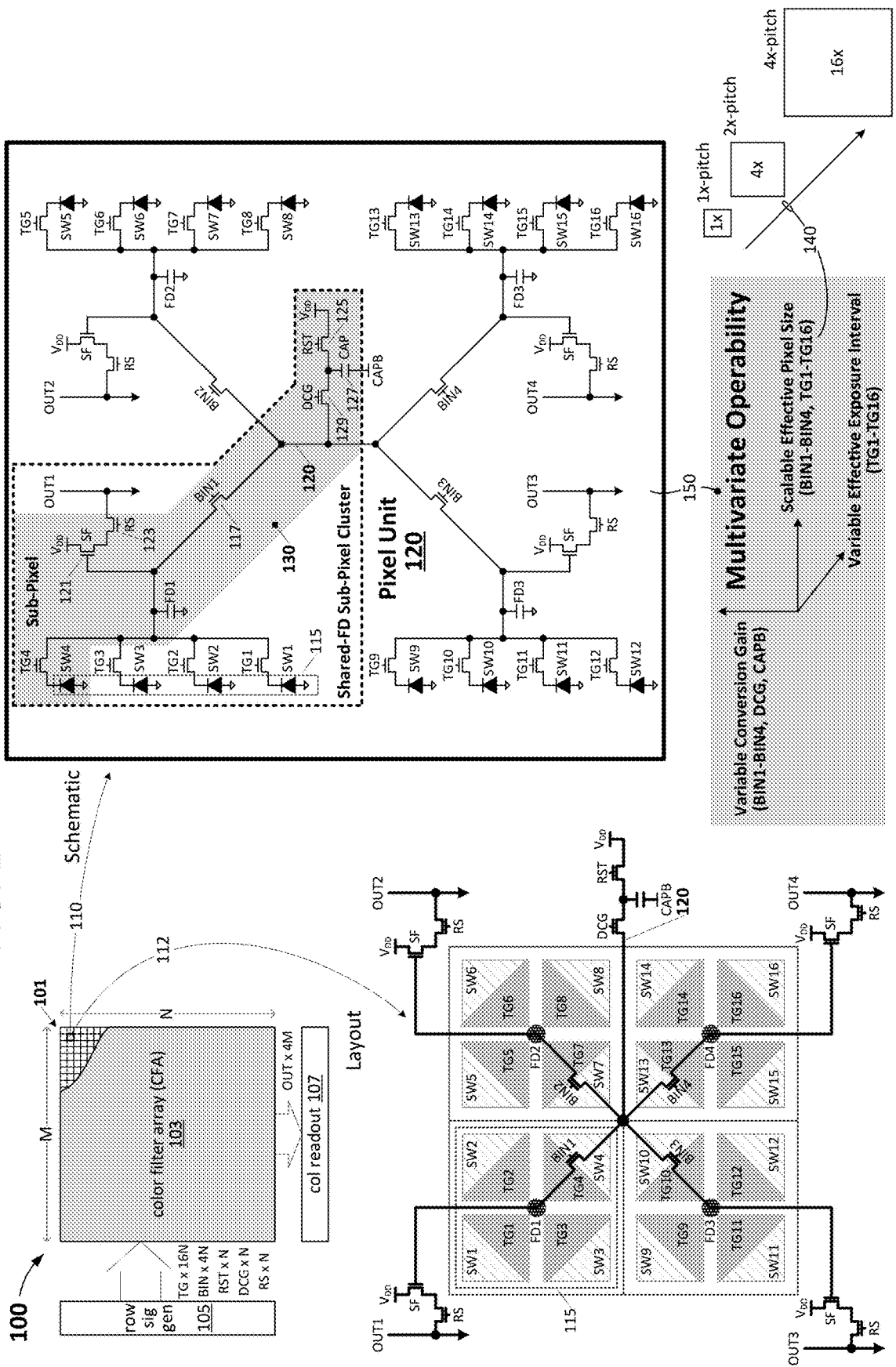
FIG. 1 illustrates an embodiment of an image sensor having an array of size-scalable pixels.
Figure 9:
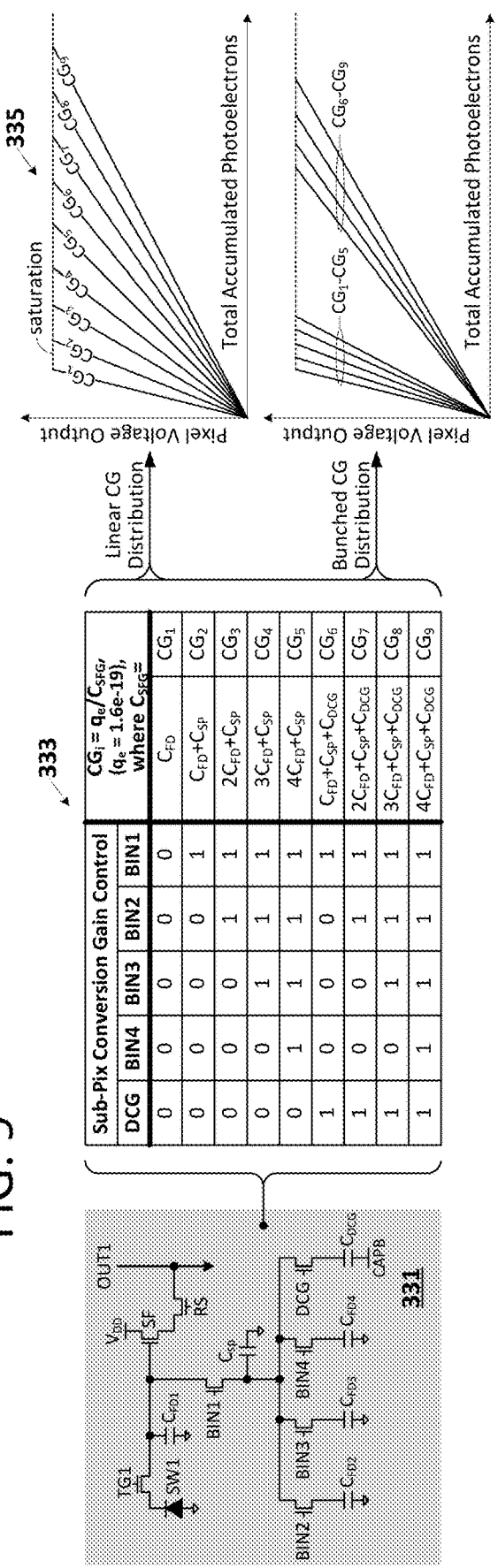
Figure 10:
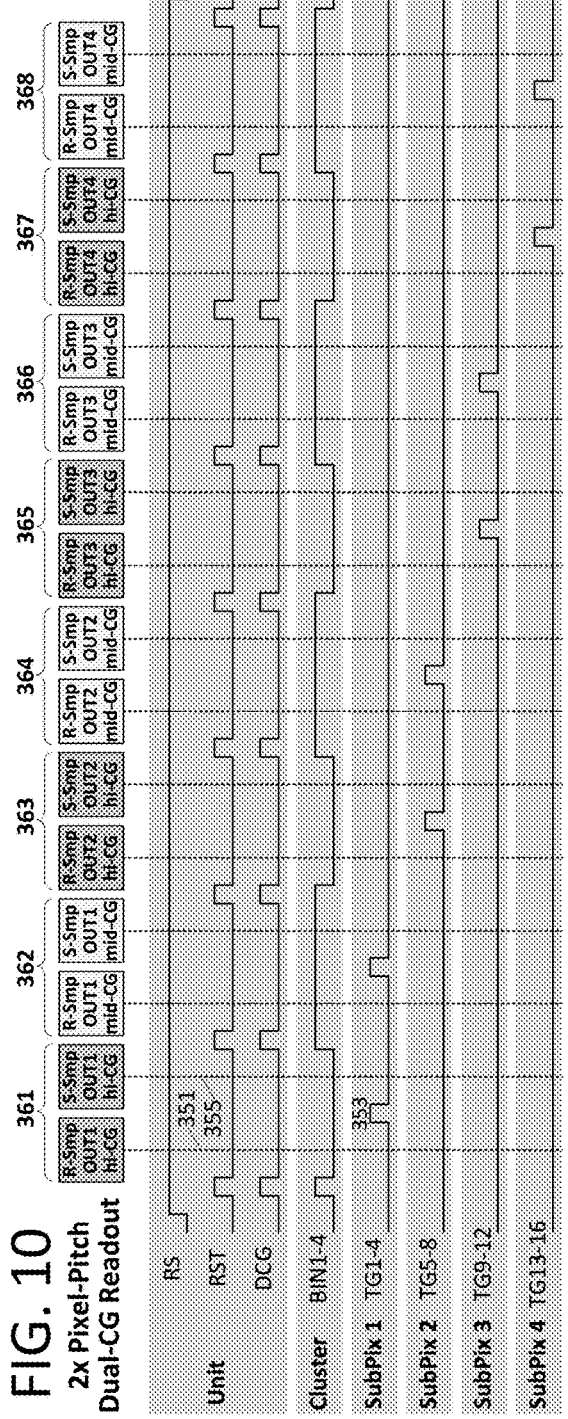
Figure 11:
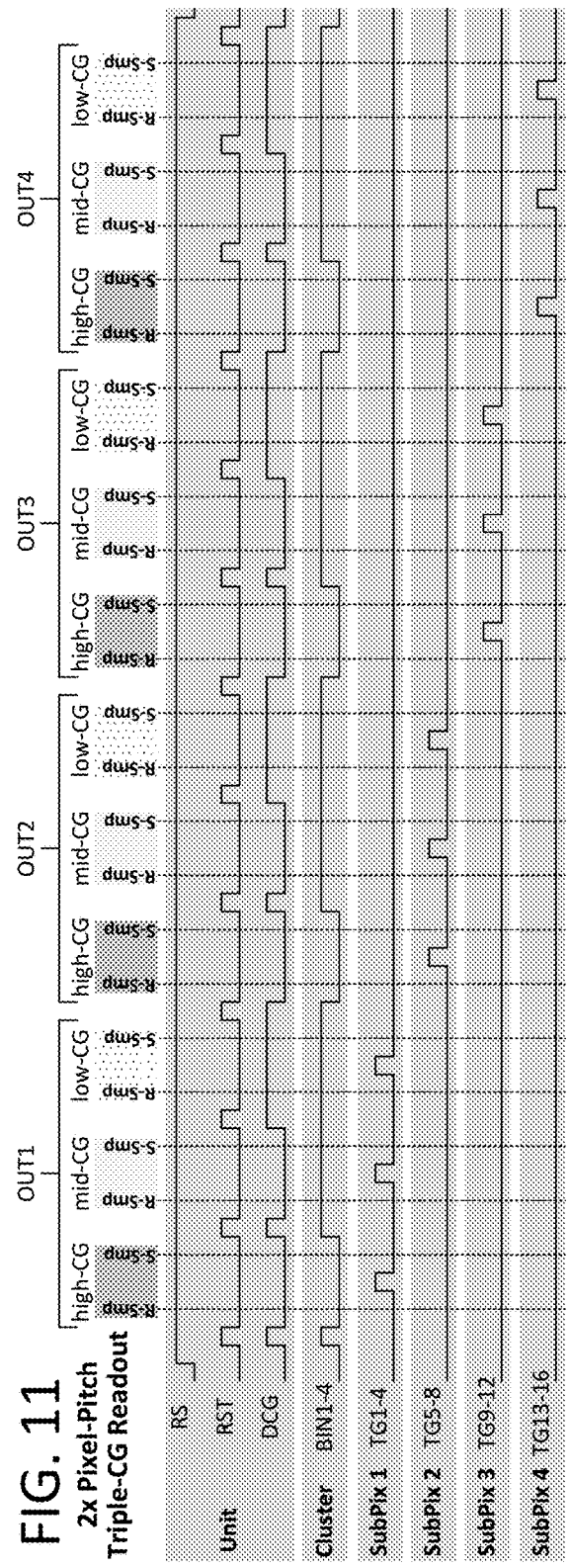
Figure 12:
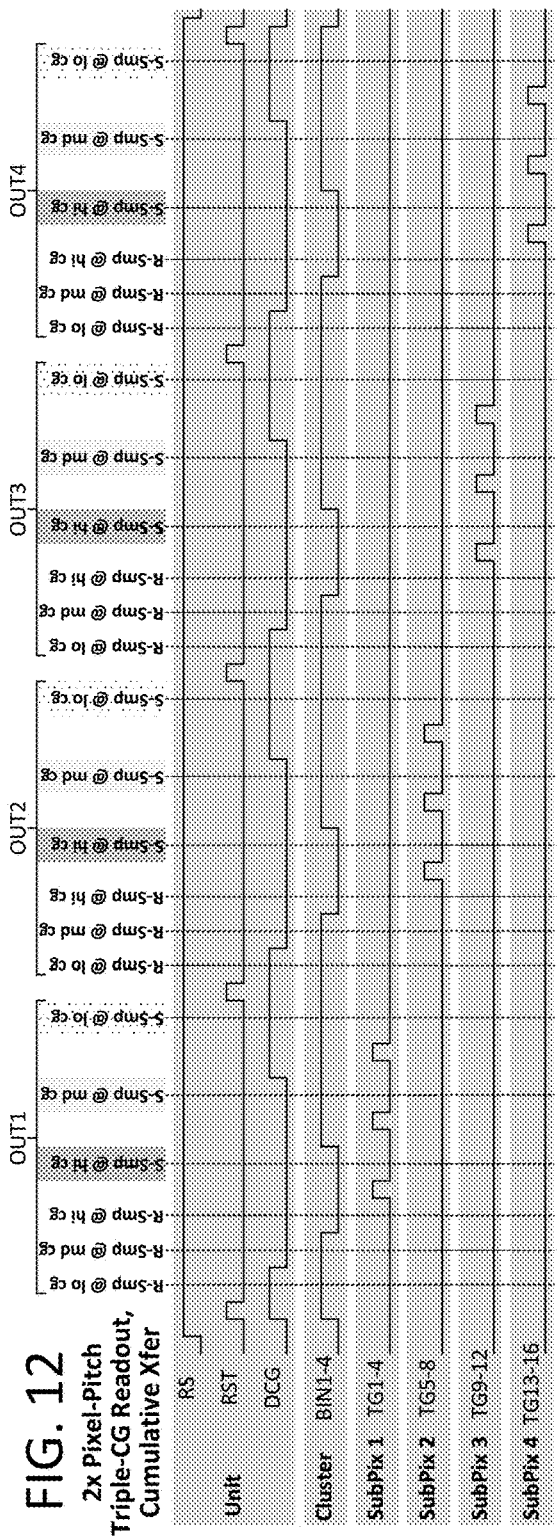
Figure 14:
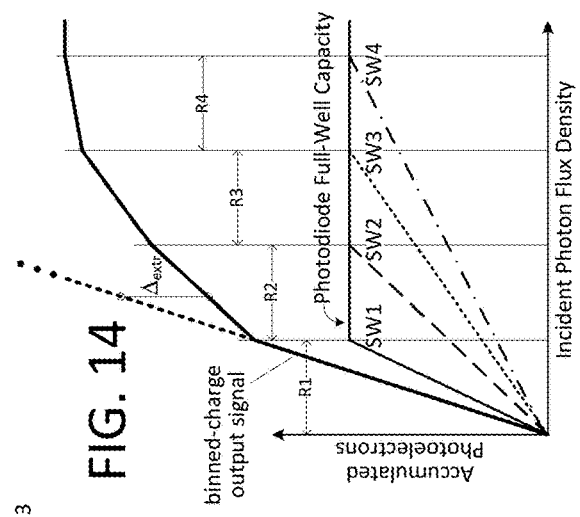
Figure 13:
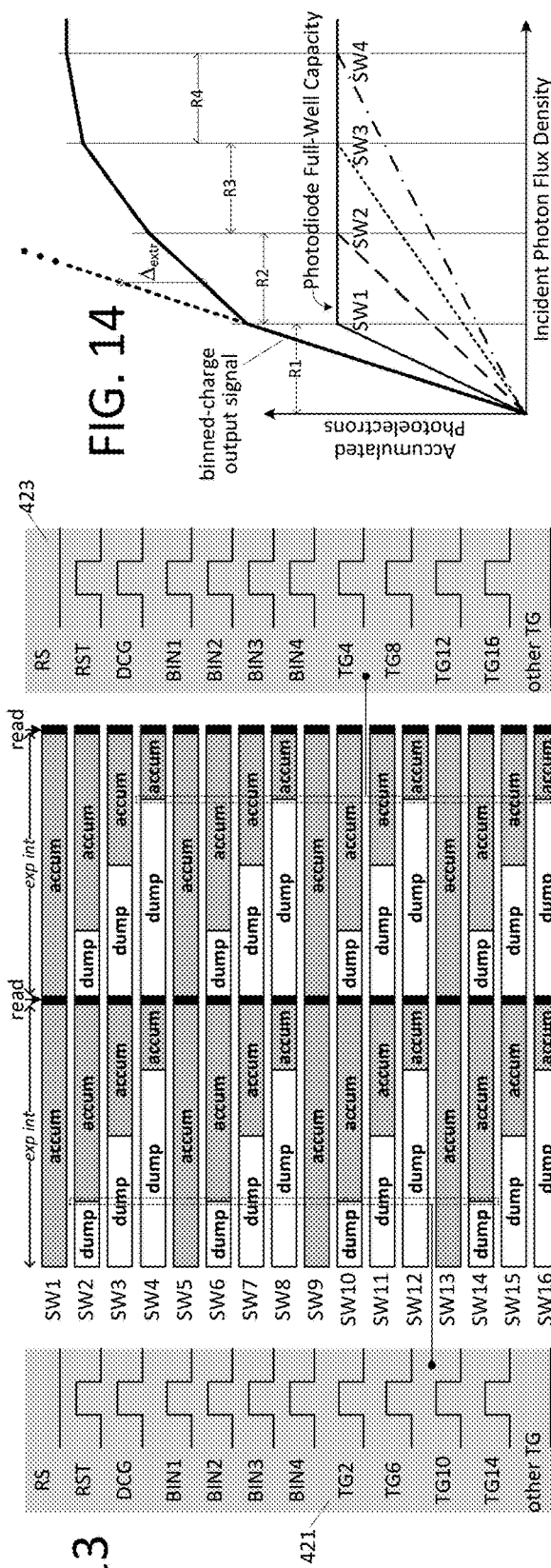
Figure 15:
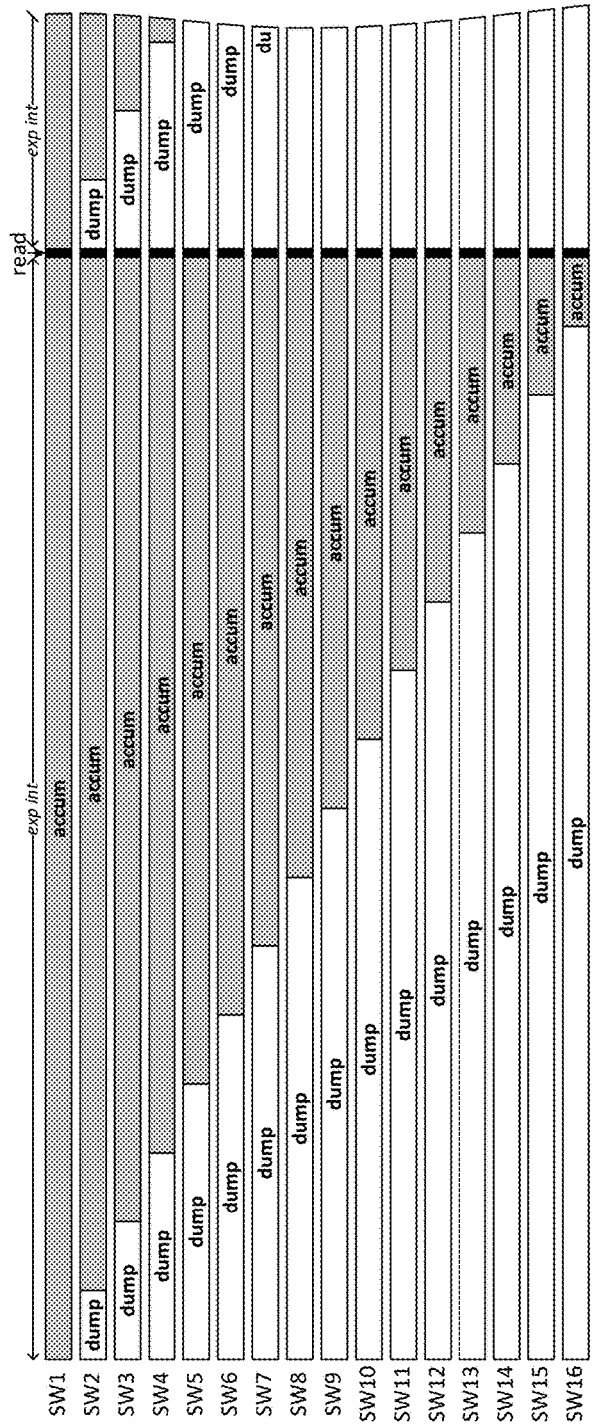
Figure 16:
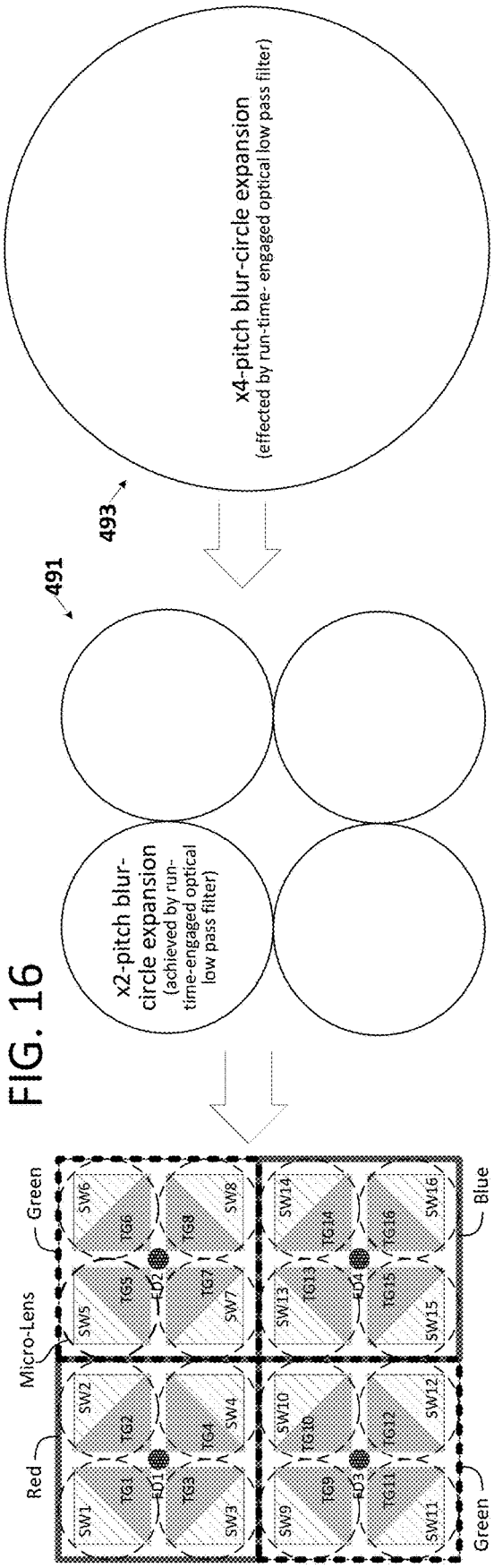
Figure 17:
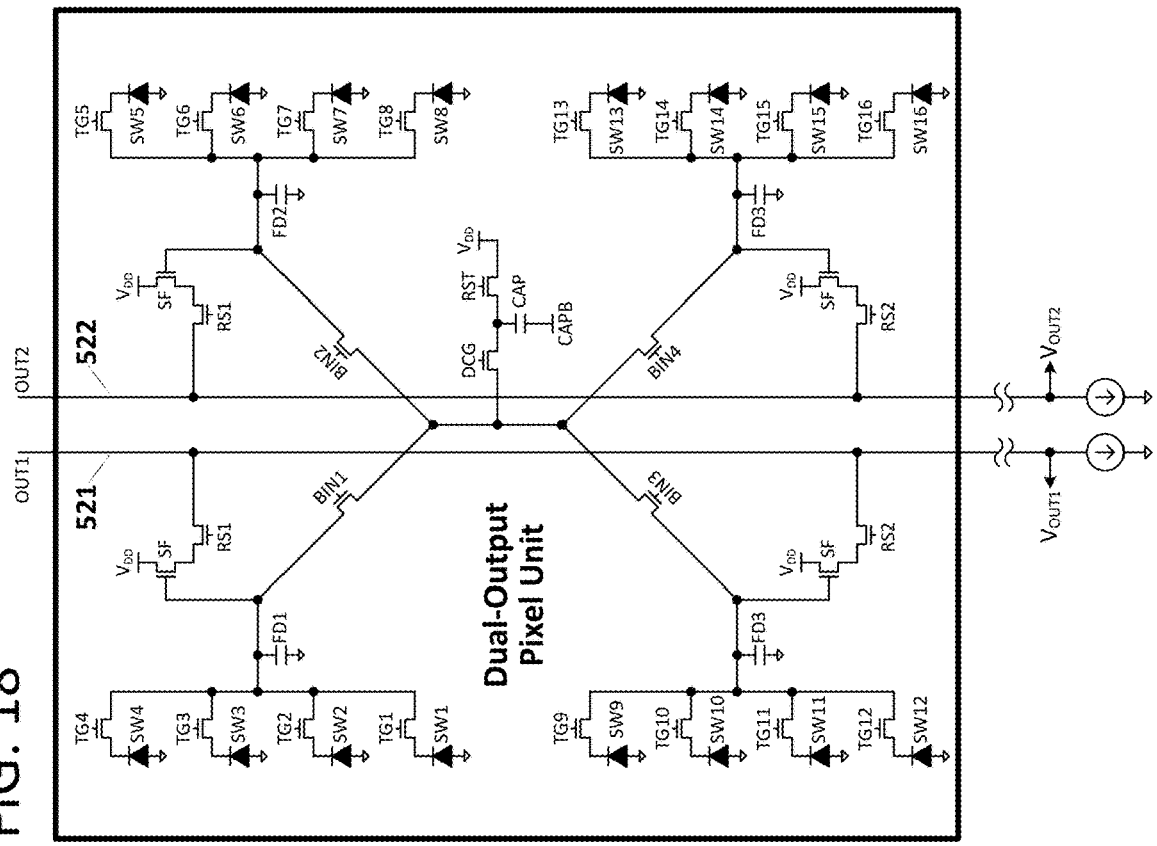
Figure 18:
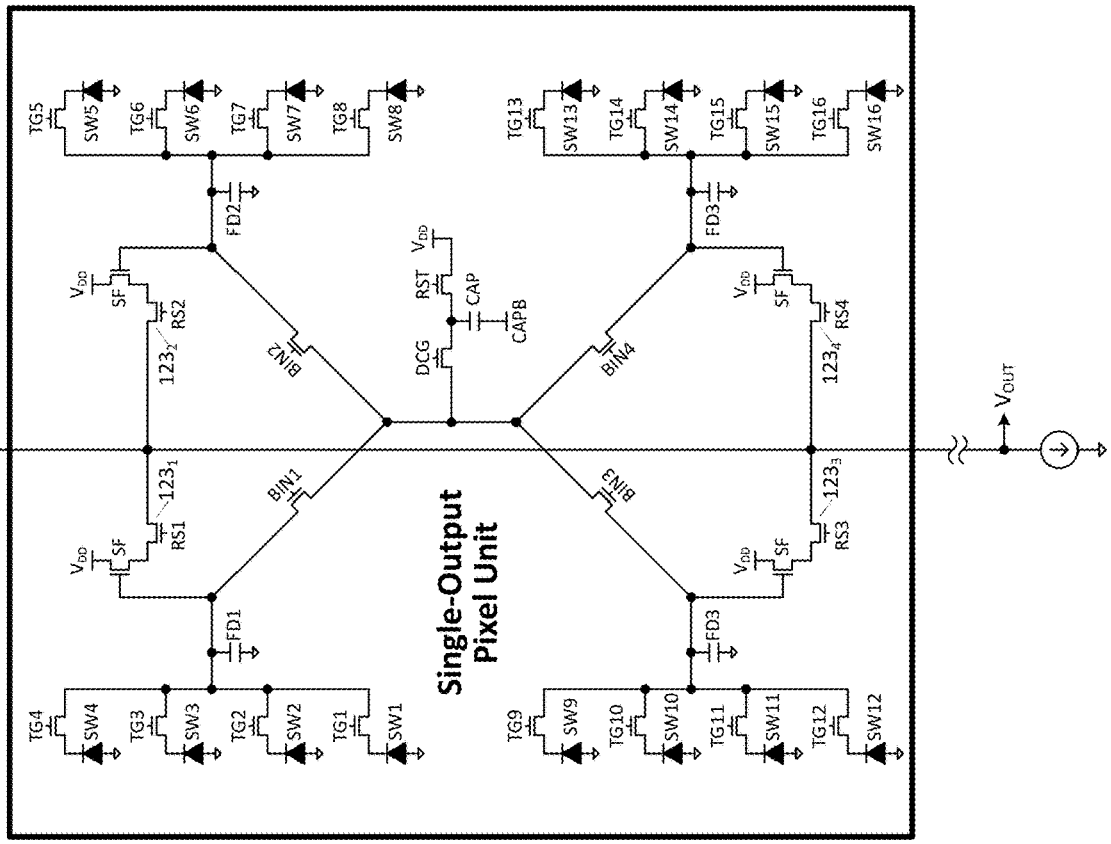
Figure 20:
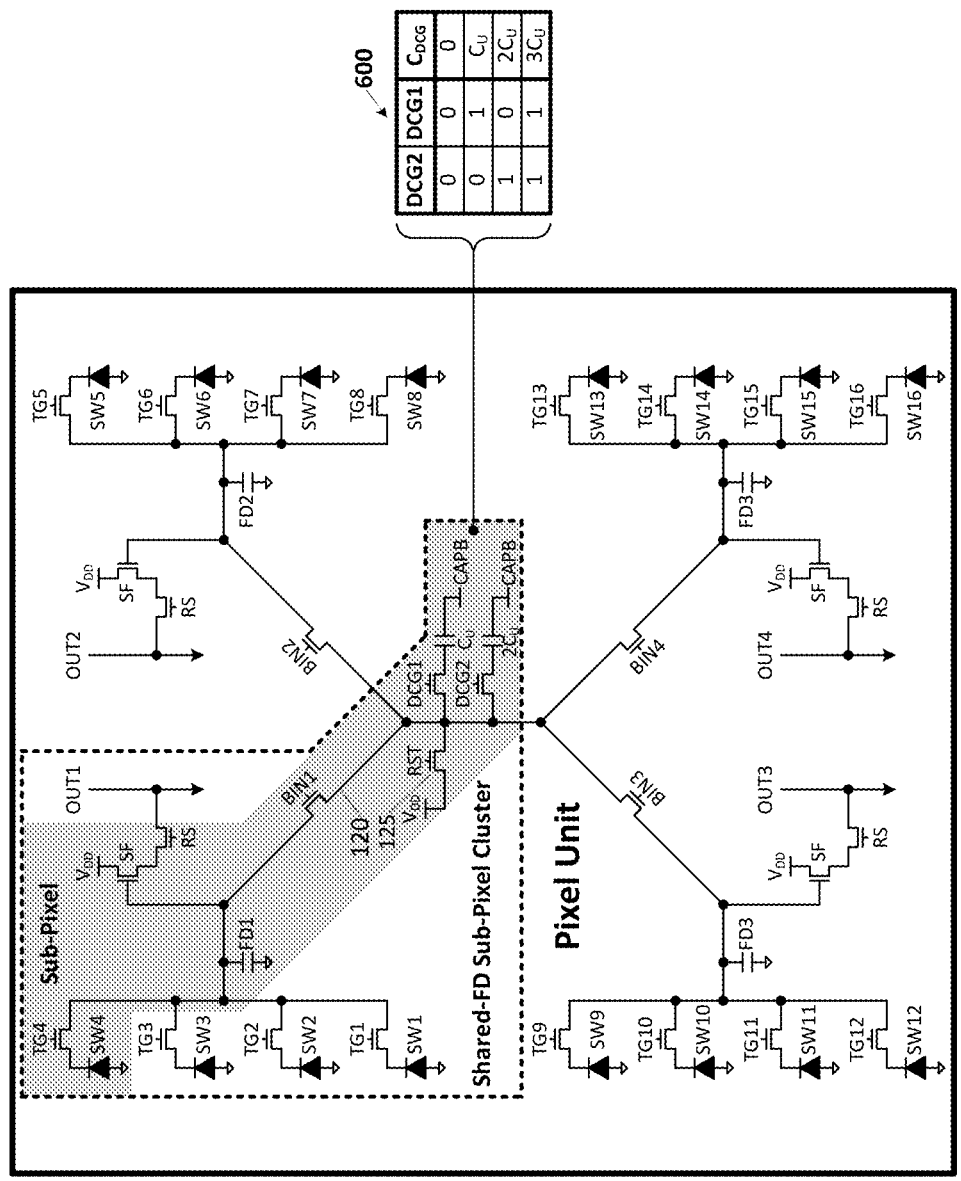

FIG. 7 presents an exemplary charge-transfer diagram for a ×4-pitch two-phase (dual-gain/dual-charge-transfer) readout;

FIG. 8 presents an exemplary charge-transfer diagram for an alternative multi-gain readout with respect to a ×4-pitch (maximum-size) pixel in which reset-state sampling with respect to both gain configurations is executed prior to signal-state sampling for either gain configuration and in which photocharge is cumulatively transferred into the collective source-follower capacitance in successive charge-transfer operations;

FIG. 9 illustrates an exemplary set of nine conversion gains that may be selected during ×2-pitch and ×1-pitch (intermediate and minimum pixel sizes) readout;

FIG. 10 illustrates an exemplary ×2-pitch readout control sequence that yields CDS readouts with dual (two different) conversion gains;

FIG. 11 illustrates an exemplary ×2-pitch readout control sequence that yields CDS readouts at high, medium and low conversion gains;

FIG. 12 illustrates an alternative triple-gain readout sequence for the ×2 (intermediate) pixel configuration, implementing the cumulative charge transfer operation described generally in reference to FIG. 8;

FIG. 13 illustrates a modulated-exposure readout sequence that may be applied to increase dynamic range within pixel-size-scalable image sensor embodiments disclosed herein;

FIG. 14 presents an exemplary plot of net output signal voltage level against increasing photon flux density for the modulated-exposure times shown in FIG. 13;

FIG. 15 illustrates the scaled accumulation interval approach of FIG. 13 in the context of individual sub-pixels;

FIG. 16 illustrates an excerpt of the FIG. 1 pixel array architecture, showing constituent elements of an exemplary color filter array (CFA) and constituent micro-lenses of a micro-lens array that may be disposed over the pixel array to implement a color-sensitive optical system;

FIGS. 17 and 18 illustrate alternative embodiments of the FIG. 1 pixel unit having, respectively, a single four-way shared output-node and a pair of two-way shared output nodes;

FIGS. 19A-19G illustrate non-exhaustive examples of readout sequences that may be employed within the FIG. 1 pixel architecture; and FIG. 20 illustrates an alternative pixel unit architecture having binary-weighted independently-switched dynamic-conversion-gain capacitances to enable programmatic selection of additive capacitance.

DETAILED DESCRIPTION

In various embodiments disclosed herein, photodetection elements within an integrated-circuit pixel array are dynamically configurable to any of at least three uniform-aspect-ratio, size-scaled pixel footprints. In those uniform-aspect-ratio embodiments and others, pixel-footprint scaling is implemented through read-out-time control of in-pixel transfer gates associated with respective photodetection elements and binning transistors coupled between the transfer gates for respective clusters of the photodetection elements and a shared reset node—an arrangement in which each binning transistor shields a floating diffusion node for a respective photodetection-element cluster from the PVT-sensitive (process-voltage-temperature-sensitive) drain capacitance of a shared reset transistor (reducing net capacitance at a given floating diffusion node and thus increasing conversion gain and lowering read noise for small signal levels). In embodiments that enable uniform aspect ratio size-scaling, binning-transistor-interconnected clusters of photodetection elements have a collective aspect ratio that matches (or nominally matches) the aspect ratio of each individual photodetection-element cluster and each individual photodetection element. Accordingly, a readout signal may be generated exclusively in response to (i) photocharge accumulated within an individual photodetection element to effect a minimum effective pixel size (maximum spatial resolution within the pixel array), (ii) photocharge collectively accumulated within a cluster of photodetection elements to effect a larger effective pixel size, and (iii) photocharge collectively accumulated within multiple binning-transistor-interconnected clusters of photodetection elements to effect a yet larger, maximum effective pixel size (minimum spatial resolution within the pixel array). In yet other embodiments, the binning transistors are selectively activated during high-resolution readout (i.e., any readout at less than maximum effective pixel size) to achieve variable conversion gain, including multiple readouts per exposure with respective conversion gains. To further extend the range and/or resolution of selectable conversion-gains, one or more additional capacitive elements may be coupled via dynamic-conversion-gain transistor(s) to the shared reset node (either in parallel or series with the reset transistor). In a number of embodiments the additional transistor-switched capacitance is programmably scalable to enable run-time calibration of the selectable conversion gains. In yet other embodiments, photocharge clearing/dumping operations are executed for subsets of photodetection elements for extended dynamic range. These and other features and embodiments are discussed in further detail below.

FIG. 1 illustrates an embodiment of an image sensor 100 having an array of size-scalable pixels 101, color filter array 103 (overlaid on the size-scalable pixel array), row signal generator 105 and column readout circuitry 107. Referring to schematic view 110 and corresponding layout view 112, each size-scalable "pixel unit" 120 includes four clusters 115 of photodetection elements disposed in respective quadrants of the pixel unit. Each of the four photodetection elements within a given cluster (denoted by "SWn" where SW refers to the photocharge storage well of the photodetection element and 'n,' the photodetection element index, ranges from 1 to 16) is coupled via a respective transfer gate (TGn) to a shared floating diffusion node for the cluster (FD1 for upper left cluster, FD2 for upper right cluster, FD3 for lower left cluster and FD4 for lower right cluster), and the per-cluster floating diffusion nodes are coupled via respective binning transistors 117 to a common/shared reset node 120. In the embodiment shown, each of the binning transistors is controlled by a respective per-pixel-row binning signal (BIN1, BIN2, BIN3, BIN4) though a single binning signal may control all four binning transistors in alternative embodiments. The floating diffusion node for each cluster of photodetection elements and associated transfer gates is coupled to a respective amplifier transistor 121 that drives, via read-select transistor 123, a respective per-cluster output line (i.e., OUT1, OUT2, OUT3, OUT4). Each individual photodetection element together with its transfer gate (TG) and TG-interconnected floating diffusion node, readout circuit (implemented by transistors 121, 123), binning transistor 117, reset node 120, reset transistor 125 (and optional dynamic-conversion-gain capacitance 127 and transistor 129)—as shown by the shaded region 130—is referred to herein as a sub-pixel, and the set of sub-pixels that share the same floating diffusion node (FD) and readout circuit are referred to herein as a shared-FD sub-pixel cluster (or sub-pixel cluster, for short).

In the FIG. 1 embodiment, the per-cluster output lines (OUT1-OUT4) are biased by respective current sources to operate each of the four amplifier transistors 121 as a respective source-follower (SF) for which the voltage at the source terminal of the amplifier transistor ("source follower transistor") follows the voltage at the gate of the amplifier transistor. Common-source amplification schemes or others may be implemented in alternative embodiments or (and/or programmatically selected) configurations (e.g., programmatically selected configurations). Similarly, each of the photodetection elements (designated by "SW," in view of operation as a photocharge storage well) is implemented by sub-diffraction-limit (SDL) pinned photodiode (PPD) in the FIG. 1 embodiment—that is, a pinned photodiode having a footprint (i.e., layout area) smaller than the Airy Disk for the wavelength of light passed by an overlaid element of the color filter array. In alternative embodiments, individual photodetection elements may be sized larger than or nominally equal to the diffraction limit. Also, while photodetection elements are assumed to be pinned photodiodes (pinned PDs) in various embodiments presented herein, any other practicable photodetection element may be deployed in all cases.

Referring still to schematic and layout views 110 and 112 of FIG. 1, the transfer gates and binning transistors make it possible to select, as the minimum effective pixel size within the pixel unit, any single photodiode (PD) within any four-PD cluster for individual readout—that is, switching on the transfer gate corresponding to a single photodiode to enable photocharge transfer to the cluster floating diffusion node (FD) and thereby produce a signal on the cluster output line that nominally matches (with possible DC offset) the voltage on the cluster FD. An intermediate effective pixel size with nominally the same aspect ratio as the minimum effective pixel size may be selected by switching on all transfer gates within a given cluster (simultaneously or staggered within a readout interval) to transfer photocharge from four clustered photodiodes to their shared floating diffusion (i.e., "binning" the photocharge from same-cluster photodiodes within the cluster FD) to produce a corresponding ×4 PD pixel signal. A maximum effective pixel size also having nominally the same aspect ratio as the minimum-footprint pixel (and thus an aspect ratio that also matches the intermediate pixel) may be selected by charge-binning the outputs of four intermediate pixels (i.e., each of the four clusters)—that is switching on all transfer gates (TG1-TG16) within pixel unit 120 during a given readout interval and also switching on the four binning transistors 117 to electrically couple the four cluster floating diffusion nodes (FD1-FD4) to one another.

Because binning transistors 117 (i.e., transistors controlled by respective signals BIN1-BIN4 and thus occasionally referred to herein by that signal name) remain switched off for small and mid-size pixel readout in the output-per-cluster embodiment of FIG. 1, any of the four small pixels (i.e., single-PD pixels or sub-pixels) within a given cluster may be readout concurrently with any of the small pixels within each of the other three clusters (i.e., four small pixels within respective clusters read out at the same time via respective readout circuits), and four mid-size (4-PD) pixels may likewise be concurrently readout via respective readout circuits. By contrast, all four binning transistors are switched on for maximum-size (16-PD) pixel readout so that the same charge-binned voltage is applied to all four readout circuits (i.e., same voltage present at the gates of all four source-follower transistors 121) and thus each readout circuit should, if activated (i.e., by switching on the read-select transistor for that readout circuit), produce nominally the same output voltage on respective output lines OUT1-OUT4. In a number of embodiments, the outputs of all four readout circuits may be sampled by the column readout circuitry (107) during maximum-size pixel readout to generate four nominally identical pixel values, with algorithmic combination or selection of individual pixel values (e.g., in analog domain or, after analog-to-digital conversion of individual signals within circuitry 107, in the digital domain). Alternatively, signals generated on the four output lines coupled to a given column of pixel units 120 may be evaluated during system startup or production time testing to determine a lowest-noise output line for each pixel unit within a given row, storing (for example) a bit-map that may be applied to control the read-select transistors for the pixel unit during mission-mode operation (i.e., driving a given one of the output lines for each pixel unit) and/or specify which of the four output lines per pixel unit is to be sampled. To reduce mapping data overhead, a shared row-map (rather than an independent map per row) may be applied for all rows of pixel units to select one of the output lines to be used for maximum-size pixel readout. In other embodiments, a default readout circuit (e.g., circuit that drives OUT1) may be selected (read-select transistor switched on) during maximum-size pixel readout, with all others remaining de-selected. Also, as discussed below, photocharge from all or any subset of photodiodes within a given cluster may be binned with photocharge from all or any subset of the photodiodes within one, two or all other clusters, with concurrent independent readout from any non-binned cluster with the binned-cluster readout. More generally, two independent readout signals may be generated concurrently under the following binning-transistor configurations:

TABLE 1

| Binning Transistors Switched On | Concurrent Independent Readouts |
|---|---|
| 0 | 4 |
| 1 | 4 |
| 2 | 3 |
| 3 | 2 |

The uniform aspect ratios for the minimum, intermediate and maximum pixel size configurations (also referred to herein as small, medium and large pixels or pixel sizes) are occasionally referred to herein in terms of pixel pitch—that is, a PD-normalized dimension across the row and/or column axis of the pixel array and thus 1× pitch (1 PD, smallest pixel size), 2× pitch (4 PD, intermediate pixel size), or 4× pitch (16 PD, largest pixel size) as shown at 140 in FIG. 1. Further, while individual photodiodes are depicted with substantially square aspect ratios (i.e., width nominally equal to height for unity aspect ratio) in layout view 112, photodiodes may have a non-square aspect ratio (e.g., width=f*height, where '*' depicts multiplication and 'f'=16/9, 16/10, 3/2, 4/3, etc.) which is maintained in the intermediate (2×-pitch) and large (4×-pitch) pixels. Moreover, photocharge accumulated within individual photodiodes may be binned in various combinations other than the all-PDs-per-cluster or all-PDs-per-pixel-unit combinations discussed thus far—options discussed below with respect to FIGS. 19A-19G.

Still referring to FIG. 1, floating diffusion reset within a given sub-pixel cluster is implemented via the corresponding binning transistor—switching on the binning transistor for the cluster to couple the cluster-FD to reset node 120 while also switching on reset transistor 125 and (in the FIG. 1 embodiment) dynamic-conversion-gain (DCG) transistor 129. The same is true of individual photodiodes—reset along with FD by switching on the corresponding transfer gate. This "indirect reset" operation and architecture—switchably coupling the floating diffusion node (and optionally one or more of the photodiodes) of a given sub-pixel cluster to a cluster-shared reset voltage through the binning transistor for that sub-pixel cluster provides a number of benefits relative to conventional implementations having a reset transistor coupled directly to the floating diffusion node. For one, the reset-transistor overhead within the pixel unit is reduced by a factor of four relative to conventional reset-transistor-per-readout architectures. Also, the parasitic capacitance on individual FD nodes is substantially reduced as the source/drain of only one transistor (the binning transistor) is coupled to the cluster FD (not counting the cluster transfer gates), significantly improving signal-to-noise ratio and thus low-light performance relative to conventional charge-binning architectures having parallel binning-transistor and reset-transistor connections to the floating diffusion node. Said another way, the binning transistor shields the cluster FD from the PVT-sensitive parasitic capacitance of the reset transistor—implementing a "bin-shielded reset" architecture in which both binning current and reset current (during charge-binning and reset operations, respectively) are conducted to/from a given cluster FD via through the binning transistor 117.

Continuing with FIG. 1, dynamic-conversion-gain (DCG) transistor 119 is coupled between capacitive element 127 (e.g., implemented by a metal oxide semiconductor (MOS) transistor having drain and source terminals coupled in common to a bias voltage, CAPB, where CAPB is, for example, a dedicated or shared ground or other bias potential) and shared reset node 120 and thus may be switched on or off together with one or more binning transistors to enable multiple different conversion gains to be applied with respect to a given photocharge transfer and pixel readout. More specifically, a maximum conversion gain is achieved with respect to photocharge transfer within a given cluster (and subsequent readout via the cluster readout circuit) by switching off the cluster binning transistor (e.g., deasserting BIN1 for charge transfer to FD1), an incrementally lower conversion gain is implemented by switching on the binning transistor for a solitary cluster (i.e., binning transistors 117 for all other clusters switched off) while leaving the DCG transistor off—adding the parasitic capacitance ($C_{SP}$) of the shared reset node to the FD1 capacitance to establish an incrementally increased capacitance at the gate of source follower 121 (i.e., $C_{SFG}=C_{SP}+C_{FD}$, where $C_{SFG}$ is the capacitance at the gate of source follower transistor 121, $C_{SP}$ is the parasitic capacitance of shared reset node 120 and $C_{FD}$ is the floating-diffusion capacitance), and a yet further lower conversion gain by switching on the DCG transistor together with BIN1 (i.e., conversion gain inversely proportional to $C_{SFG}$, where $C_{SFG}=C_{SP}+C_{FD}+C_{CAP}$, and $C_{CAP}$ is the capacitance of element 127). As discussed below, an additional three different conversion gains (CGs) may be implemented by switching on binning transistors 117 for one, two or three other sub-pixel clusters (concurrently with switching on the binning transistor for the cluster containing the sub-pixel(s) being readout) without switching on DCG transistor, and another additional three CGs may be implemented—nine different CGs in all—by switching on the one, two or three other binning transistors together with the DCG transistor. Thus, in addition to uniform-aspect-ratio pixel size scaling, pixel unit 120 enables each pixel readout (small, mid-size or large) to be executed with one or more dynamically selected conversion gains. Further, as discussed below, the effective exposure interval (photocharge accumulation interval) for any one or more of the photodiodes contributing to a given readout signal may be dynamically adjusted to provide enhanced dynamic range (extending the maximum distinguishable illuminance intensity) and thus yet another axis of variability. This multivariate operability is depicted graphically at 150, showing pixel-size scaling, variable applied conversion gain and variable effective exposure interval along conceptual orthogonal axes of run-time variable operation.

Figures 2, 3, 4:
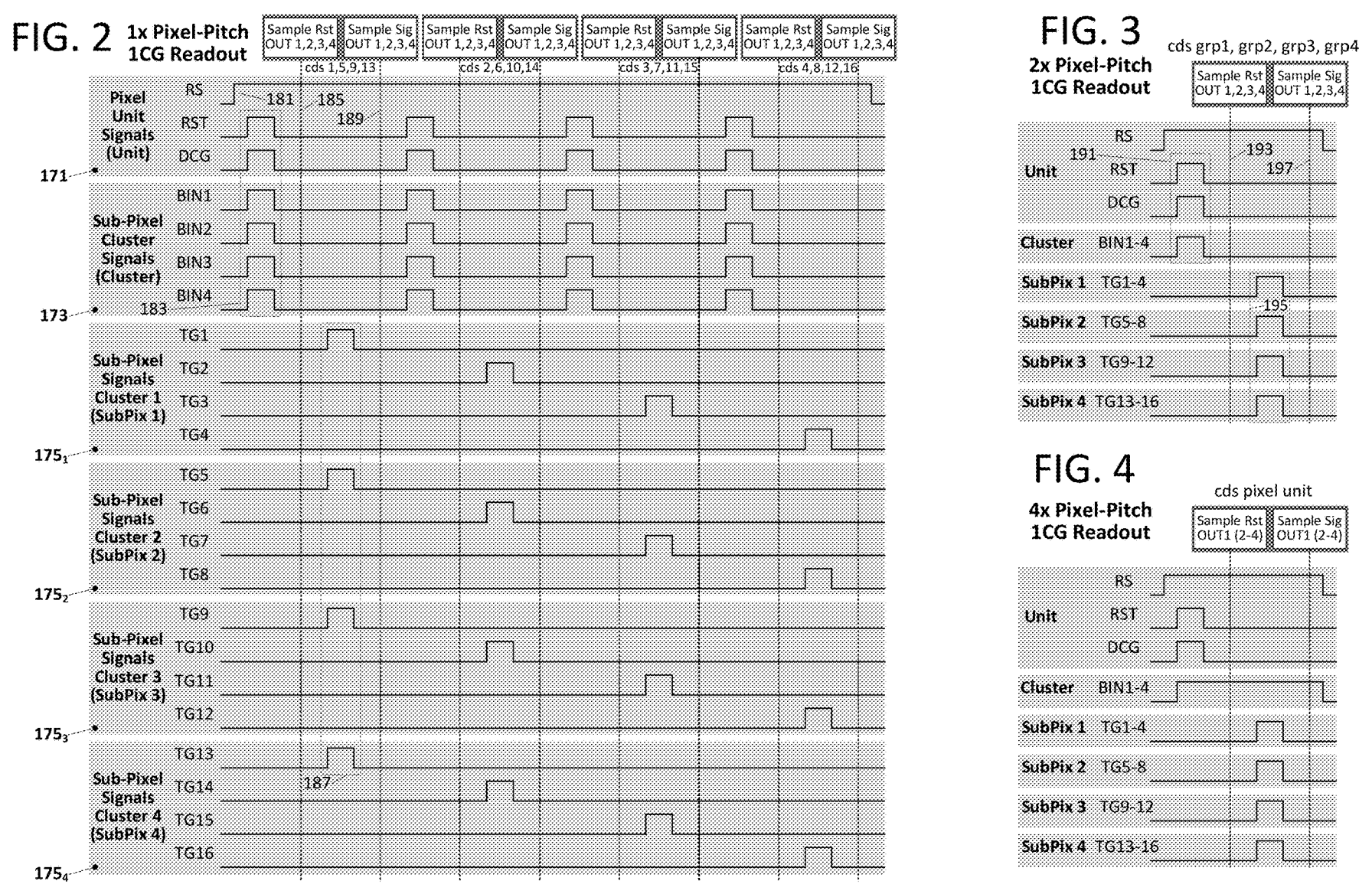

FIG. 2 illustrates an exemplary sequence of control signals generated by the FIG. 1 row controller (row signal generator) to enable post-exposure correlated-double-sample (CDS) readout with minimal pixel size (×1 pitch) and maximum conversion gain (CG). In the depicted example (and other signal timing diagrams discussed below), the control signals are split into conceptual groups as applying to the pixel unit as whole ("unit" signals 171), to whole sub-pixel clusters (cluster signals 173) or to individual sub-pixels (SubPix signals for clusters 1-4, $175_1$-$175_4$).

The FIG. 2 readout sequence enables concurrent CDS readout and generation of a corresponding digital pixel value with respect to each sub-pixel within a row of pixel units (16*M digital pixel values in a sensor having M columns of pixel units) and is repeated/iterated for each row of pixel units to implement a rolling shutter readout. Row readout commences (following an exposure interval during which photocharge is accumulated within respective photodiodes) with assertion of read-select signal (RS) at 181 to couple the source terminals of the per-cluster source-follower transistors to respective output lines (and thus enable signal sampling within column readout circuit 107 of FIG. 1). Shortly thereafter, the binning transistors for all sub-pixel clusters are pulsed together with the DCG transistor and reset transistor (i.e., switching on and then off BIN1, BIN2, BIN3, BIN4, RG and DCG as shown at 183) to reset all floating diffusion nodes (and the shared reset node). A reset-state sample is captured at 185 (reading the reset level of the per-cluster floating diffusion nodes), followed by pulsing a selected (single) transfer gate within each sub-pixel cluster as shown at 187 (to transfer photocharge transfer from a selected sub-pixel to the cluster FD), and then signal-state sampling at 189. The reset-state sample is subtracted from the signal-state sample (i.e., within column readout circuit 107 of FIG. 1) in either the analog domain followed by ADC or in the digital domain (after the two samples have been separately digitized) to yield a CDS (pseudo-differential) digital pixel value. In the example shown, the initial CDS readout sequence—reset, reset-state sample, charge-transfer and signal-state sample—is implemented concurrently with respect to sub-pixels 1, 5, 9 and 13 (one sub-pixel per cluster with reset-state and signal-state sampling via respective cluster output lines OUT1-OUT4), and then repeated three more times (for sub-pixels 2, 6, 10, 14; then sub-pixels 3, 7, 11, 15; and then sub-pixels 4, 8, 12, 16) to complete the minimum-pixel-size (maximum resolution) readout.

FIG. 3 illustrates an exemplary sequence of control signals generated by the FIG. 1 row signal generator (i.e., readout sequence repeated for each row of pixel-units to effect rolling-shutter readout) to enable post-exposure CDS readout at intermediate pixel size (×2 pitch) and maximum conversion gain. As shown, following reset operation at 191 (and during read-select signal assertion) and reset-state sampling at 193, transfer gates for all four photodiodes in a given cluster are simultaneously pulsed as shown at 195 (so that all TGs within the 16-PD pixel unit are pulsed) to effect intra-cluster charge-binned readout. That is, accumulated photocharge within each photodiode of a given cluster is transferred to the shared floating diffusion node for that cluster (intra-cluster charge binning) to produce, via the cluster source follower transistor and read-select transistor, a respective ×2-pitch output signal on each of output lines OUT1-OUT4 for signal-state sampling at 197. FIG. 4 illustrates an exemplary control signal sequence that enables post-exposure CDS readout at maximum pixel size (×4 pitch) and maximum ×4-pitch conversion gain. The signal sequence is similar to that of the ×2 pixel-pitch readout, but with the four BIN transistors switched on throughout the reset-state sampling, charge-transfer and signal-state sampling operations to switchably couple the four per-cluster floating diffusion nodes to one another and thus form a unified pixel-unit-wide capacitance to which charge from all PDs (16 PDs in the FIG. 1 example) is transferred. As the signal level at the gates of the four per-cluster source follower transistors is nominally the same, a predefined one (or more) of the output lines may be sampled to obtain the ×4-pitch reset-state and signal-state samples.

Figure 5:
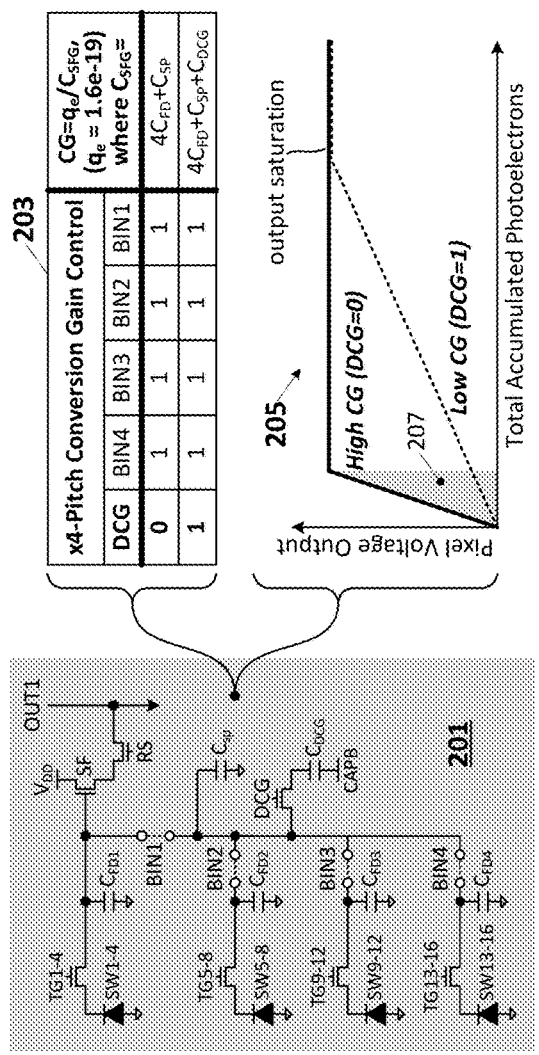
FIG. 5 illustrates alternate high and low conversion gains that may be selected during ×4-pitch (maximum pixel size) readout showing a simplified circuit model of gain-relevant capacitances.

FIG. 5 illustrates alternate high and low conversion gains that may be selected during ×4-pitch (maximum pixel size) readout showing a simplified circuit model of the CG-relevant capacitances 201, a truth table 203 illustrating control signal states for high and low conversion gains at ×4-pitch high (i.e., DCG=0 or 1 for high and low CG respectively, while BIN1-BIN4 are asserted for both CGs to establish the large pixel size), and an exemplary plot 205 of pixel output voltage (analog readout signal generated on OUTn) versus total photocharge accumulation (net accumulation within all PDs of pixel unit). Referring to circuit model 201 and truth table 203, the four floating diffusion nodes (modeled by capacitances $C_{FD1}$, $C_{FD2}$, $C_{FD3}$, $C_{FD4}$) are switchably coupled in parallel with each other (via BIN1, BIN2, BIN3, BIN4) and with the parasitic capacitance of the shared reset node ($C_{SP}$) so that, when the dynamic gain control transistor is switched off (DCG=0), the net capacitance at the gate terminal of the output-circuit source follower transistor ($C_{SPG}$) is nominally equal to $C_{SP}+4C_{FD}$ (assuming same floating diffusion capacitance per cluster—a capacitance which may be purposefully varied from cluster to cluster in alternative embodiments). When the DCG transistor is switched on, $C_{SFG}$ is increased by $C_{DCG}$ and thus to $4C_{FD}+C_{SP}+C_{DCG}$. As the conversion gain is inversely proportional to net capacitance $C_{SFG}$ (e.g., as shown in table 203 of FIG. 5), deassertion and assertion of the DCG signal yields relatively high and relatively low conversion gains, respectively, and thus the relatively high and low output voltage slopes as shown in plot 205. In the low-light range shown by the shaded region 207 (within plot 205), the high-gain signal provides substantially better noise performance (lower input-referred noise due to higher conversion gain), while the higher illuminance intensities beyond shaded region 207 (which saturate the high-gain output) can be differentiated by the lower gain output.

Figure 6:
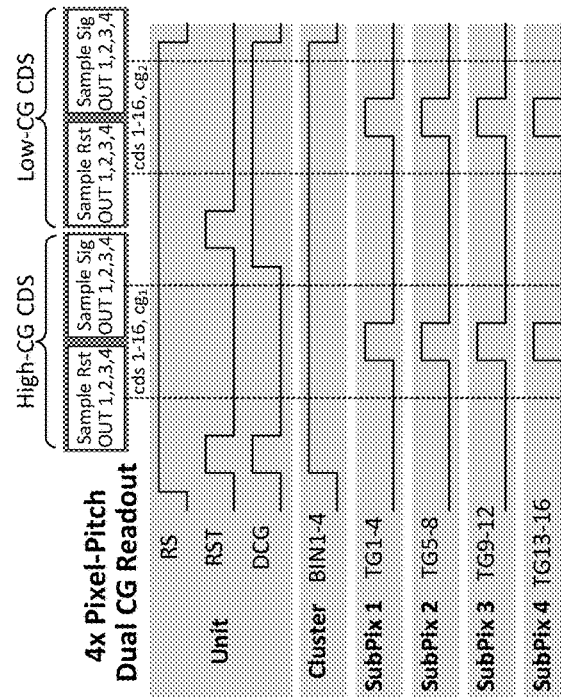
FIG. 6 illustrates successive ×4-pitch high-gain and low-gain CDS readouts executed to obtain the benefits of low-light sensitivity (high-gain readout) and bright-light differentiation (low-gain readout)

FIG. 6 illustrates successive ×4-pitch high-gain and low-gain CDS readouts executed to obtain the benefits of low-light sensitivity (high-CG readout) and bright-light differentiation (low-CG readout) and thus extend dynamic range beyond that achievable with a single conversion gain. In one embodiment, output saturation occurs when the voltage level at the gate of the source-follower transistor reaches the photodiode pinning voltage, so that any PD-accumulated photocharge beyond that which raises the source-follower gate potential to the pinning voltage remains in the photodiode following the high-CG photocharge transfer. Accordingly, absent an illuminance level that saturates the low-gain output (extreme bright light), the photocharge transferred in the high-gain readout and the photocharge transferred in the low-gain readout constitute complementary fractions of the total photocharge accumulated within the collective PDs during the preceding exposure interval so that the high-CG and low-CG readouts may be summed (in the analog or digital domain) to yield a pixel output value having higher dynamic range than achievable with a single-gain readout. This ×4-pitch dual-gain/dual-charge-transfer operation is illustrated in the exemplary charge-transfer diagram of FIG. 7. As shown, photocharge (Q) is accumulated within the pinned photodiodes of the pixel unit (collectively designated "PPD") during a bright-light exposure (250). While in the high-gain configuration (DCG=0), the collective source-follower-gate capacitance (i.e., $C1_SF$=bin-transistor-inter-coupled floating diffusion nodes and reset-node parasitic capacitance) is reset at 251 (precharged to a relatively high, predetermined potential such as $V_{PIX}$ or $V_{DD}$) with ensuing reset-state sample at 253. At 255, the transfer gates for the contributing PPDs (e.g., PD1-PD16 in the FIG. 1 architecture) are pulsed to enable charge transfer into $C1_{SF}$ which fills (with a q1 fraction of Q) up to the photodiode pinning voltage, leaving photocharge q2 (q2=Q−q1) within PPD as shown at 256. After obtaining a signal-state sample at 257 (completing, with the reset-state sample at 253, an initial CDS sampling operation), DCG is asserted to reduce the conversion gain (increasing the source follower capacitance to $C2_{SF}=C1_{SF}+C_{DCG}$), followed by $C2_{SF}$ reset at 261, reset-state sample at 263, residual charge transfer at 265, and final signal-state sample at 267 (completing, with the reset-state sample at 263, a final CDS sample). In one embodiment, the initial and final CDS samples are separately digitized and then added in the digital domain to yield a final pixel value for the ×4-pitch pixel. Alternatively, the two CDS samples may be added in the analog domain (e.g., within sample-and-hold circuitry, auto-zeroing/integrating amplifier, etc.) and then digitized to produce the final pixel output value.

In a low-light condition (shown at 270 in FIG. 7), the initial photocharge transfer may completely empty the PPD—a condition determinable by comparing the initial CDS sample (before or after conversion to digital domain) with a threshold corresponding to the charge-transfer saturation point (i.e., VPIN). Where the initial photocharge transfer completely empties the PPD, results produced by the final charge transfer and CDS sampling may be discarded either in the analog or digital domain—for example, by zeroing the final CDS result prior to addition with the initial CDS value (or refraining from adding the final CDS result or even executing the final CDS sampling).

FIG. 8 illustrates an alternative multi-gain readout with respect to a ×4-pitch (maximum-size) pixel in which reset-state sampling with respect to both gain configurations is executed prior to signal-state sampling for either gain configuration and in which photocharge is cumulatively transferred into the collective source-follower capacitance in successive charge-transfer operations. More specifically, at the conclusion of an exposure interval in which photocharge Q is accumulated within the collective set of photodiodes (i.e., within PPD), the pixel unit is configured for the lowest gain configuration (DCG=1) and then reset (pulsing BIN1-BIN4, and RST signals while DCG is held high). Thereafter, successive reset-state samples are captured with progressively increased conversion gain—capturing a reset-state sample at $C2_{SF}$ (301, while DCG=1), and then at $C1_{SF}$ (303, after switching DCG to 0)—and then successive charge-transfer/signal-state sampling operations are executed at progressively reduced conversion gain as shown at 305 and 307 (with intervening conversion gain reduction at 309). In low-light conditions that yield a complete PPD emptying (i.e., q1=Q, q2=0), the high CG CDS readout alone may be digitized (i.e., subtracting the high CG reset-state sample at 303 from the high-CG signal-state sample at 305 in either the analog or digital domain) to produce the pixel output value, with the low CG readout (CDS formed by initial reset-state sample and final signal-state sample) may be discarded or zeroed or otherwise omitted. Conversely, in brighter light conditions the low-CG CDS readout (low-CG reset-state sample at 301 and low-CG signal-state sample at 307) alone may be digitized to produce the pixel output value, with the high-CG readout omitted. In this cumulative-charge-transfer (or successive-reset-state-sampling/signal-state sampling) readout approach, the signals output from both the high-gain and low-gain readouts may be evaluated to determine which to apply (as the final pixel output value) and which to discard. The following table illustrates one decision-logic implementation where "Thresh1" is a voltage level slightly more positive than $V_{PIN}$ and "Thresh2" is a voltage level slightly less positive than $V_{RST}$ (noting that $V_{RST}$ is more positive than $V_{PIN}$ in the FIG. 8 embodiment):

TABLE 2

| High-CG Readout | Low-CG Readout | Readout Applied to Generate Pixel Value |
| --- | --- | --- |
| <Thresh 1 | Don't Care | High-CG Readout |
| >Thresh 1 | <Thresh 2 | High-CG Readout |
| X | >Thresh 2 | Low-CG Readout |

Still referring to FIG. 8, instead of threshold-based selection between the low-CG and high-CG readouts, those readouts may be normalized (e.g., one readout or the other scaled according to the ratio of the two gains) and then combined to smooth the transition between high-gain-only readout and low-gain-only readout. More generally, in all multi-gain readouts herein, the readout signals/values obtained at different gains may be normalized (e.g., based on CG ratios and/or other information determined during run-time and/or production time calibration) in analog or digital domain within column readout circuitry (e.g., element 107 of FIG. 1) or other on-chip or off-chip circuitry to enable weighted combination of pixel output signals/values.

FIG. 9 illustrates an exemplary set of nine conversion gains that may be selected during ×2-pitch and ×1-pitch (intermediate and minimum pixel sizes) readout. Simplified circuit model 331 illustrates the capacitances that may be ganged in various combinations to yield the different conversion gains (shown with respect to a solitary photodiode, but equally applicable to concurrent photocharge transfer from two, three or all four PDs within a given cluster), and truth table 333 illustrates the control signal states that yield the different conversion gains. The top and bottom entries in table 333 (designated $CG_1$ and $CG_9$, respectively) correspond to maximum and minimum conversion gain configurations, while the conversion gains for entries between those extremes may be distributed in various order according to the relation between $C_{FD}$ (FD capacitance), $C_{SP}$ (reset-node parasitic) and $C_{DCG}$ (dynamic-gain capacitance). In one embodiment, the dynamic gain capacitance is programmatically adjusted during image sensor startup (e.g., executing a calibration operation in which the bias voltage applied to source and drain of a MOS-based capacitor and/or switched combination of a variable number of component capacitive elements are iteratively adjusted) to a target value that yields a desired gain distribution, including (for example and without limitation):

- $C_{CDG}=C_{FD}$ to yield descending, relatively linear conversion-gain steps from $CG_1$ to $CG_9$ as shown at 335;
- $C_{DCG}=C_{FD}/2-C_{SP}$ to provide a $0.5*C_{FD}$ gain step between setting $CG_1$ and $CG_6$;
- $C_{DCG}=C_{FD}-C_{SP}$ to yield five nominally linear gain steps from $C_{FD}$ to $5C_{FD}$ through settings $CG_1$, $CG_6$, $CG_7$, $CG_8$ and $CG_9$; or
- or to $C_{DCG}=n*C_{FD}$ (where n>1) to enable bunched gain distributions with relatively fine gain steps within a high-gain range from CG1-CG5 and relatively fine gain steps within low-gain range from CG6 to CG9, and a relatively wide gap between those two ranges (e.g., gap width according to programmable factor 'n')

FIG. 10 illustrates an exemplary ×2-pitch readout control sequence that yields CDS readouts with dual (two different)

conversion gains—one dual-CDS-readout set for each of four 2×-pitch (intermediate-size) pixels and thus eight successive CDS readouts in all. As shown, the CDS readout at each gain setting commences with a $C_{SFG}$ reset operation (i.e., concurrently pulsing RST, DCG and BIN1-BIN4 to reset/pre-charge the capacitance ($C_{SFG}$) at the gate terminal of the source-follower transistor for the corresponding output line). After $C_{SFG}$ reset, a reset-state sample is captured (351), followed by a photocharge transfer (353) and then a signal-state sample (355). In the high-CG readouts (361, 363, 365, 367), DCG and BIN1-BIN4 are lowered during charge-transfer and signal-state sampling to yield conversion gain $CG_1$ as shown in table 333 of FIG. 9. By contrast, in the medium-CG readouts (362, 364, 366, 368), DCG is lowered while BIN1-BIN4 are asserted during charge-transfer and signal-state sampling to yield conversion gain $CG_5$ (per FIG. 9).

FIG. 11 illustrates an exemplary ×2-pitch readout control sequence that yields CDS readouts at high, medium and low conversion gains—one triple-CDS-readout set for each of four 2×-pitch (intermediate-size) pixels and thus 12 successive CDS readouts in all. As in FIG. 10, the CDS readout at each gain setting commences with a $C_{SFG}$ reset operation which is followed, in turn by a reset-state sample, a photocharge transfer and then a signal-state sample. In the high-CG readouts, DCG and BIN1-BIN4 are lowered during charge-transfer and signal-state sampling to yield conversion gain $CG_1$ (per table 333 of FIG. 9. In the medium-CG readouts (designated "mid-CG" in FIG. 11), DCG is lowered while BIN1-BIN4 are asserted during charge-transfer and signal-state sampling to yield conversion gain $CG_5$ (per FIG. 9), and in the low-CG readouts, DCG and BIN1-BIN4 are all asserted during the charge-transfer and signal-state sampling operations to yield conversion gain $CG_9$ (also as shown in table 333 of FIG. 9). Note that the high-gain readouts in both FIGS. 10 and 11 are executed sequentially with respect to individual sub-pixel clusters—as BIN1-BIN4 remain switched off during the photocharge transfer and signal-state sampling components of those readouts, the high-gain readouts may instead be executed concurrently for the four sub-pixel clusters (driving respective cluster readout signals onto output lines OUT1-OUT4).

FIG. 12 illustrates an alternative triple-CG readout sequence for the ×2 (intermediate) pixel configuration, in this case implementing the cumulative charge transfer operation described generally in reference to FIG. 8. That is, for each of the four ×2-pitch pixels, reset-state samples are captured for progressively increasing conversion gain configurations ($CG_1$, $CG_5$ and $CG_9$ as shown in table 333 of FIG. 9), followed by successive signal-state samples captured at progressively decreasing conversion gains (i.e., cumulatively transferring photocharge from the to the collective capacitance at the gate of the source-follower transistor for the subject output line). As discussed with respect to the ×4-pitch cumulative charge transfer sequence in FIG. 8, the CDS readout at each conversion gain may be used to determine which of the three CDS readouts (high, medium or low CG) will be applied to produce the pixel output value. Also, the time interval between a given charge transfer and corresponding signal-state sampling may be different from that shown—for example, providing longer delay between those events at high conversion gain to allow a relatively small, low-light signal to settle.

FIG. 13 illustrates a modulated-exposure readout sequence that may be applied to increase dynamic range within the pixel-size-scalable image sensor embodiments described herein. In the depicted example, monotonic (continuous, uninterrupted) photocharge accumulation within constituent photodiodes of ×2-pitch pixels commences at progressively later times within a given exposure interval, effectively scaling the output signal contribution from those photodiodes to enable intensity differentiation at illuminances that would otherwise saturate the ×2 pixel output. Referring to the clustered photodiodes having photowells SW1-SW4 (i.e., photodiodes PD1-PD4 within the upper-left cluster of the FIG. 1 pixel unit), photocharge is accumulated continuously within SW1 (PD1) throughout an exposure interval ("exp int"), while photocharge is cleared ("dumped") from SW2, SW3 and SW4 after 25%, 50% and 75%, respectively, of the exposure interval has transpired—that is, continuous photocharge within SW2, SW3 and SW4 occurs over 75%, 50% and 25%, respectively, of the total exposure interval. Accordingly, assuming a steady-state incident illuminance with respect to the PD cluster over the subject exposure interval (which may be, for example, $1130^{th}$ of a second, $1160^{th}$ of a second, or substantially longer or briefer than either of those times), the photocharge accumulated within SW2, SW3 and SW4 will be 75%, 50% and 25%, respectively, of the photocharge accumulated within SW1. Exemplary control signals issued to effect the photocharge clearing operations are shown for the 25%-of-frame and 75%-of-frame points (at 421 and 423, respectively) in successive exposure intervals—resetting selected photodiodes (PD2, PD6, PD10 and PD14 in charge-clear operation 421, and PD4, PD8, PD12 and PD16 in operation 423) by pulsing their respective transfer gates together with DCG, RST and BIN1-BIN4 (to switchably couple the selected photodiodes to the reset potential), while all other transfer gates remain switched off.

A salient consequence of the FIG. 13 approach (scaled photocharge accumulation) is that SW1-SW4 will reach full-well saturation at different illuminance intensities (i.e., at different photon flux densities as shown in FIG. 14), and more specifically at respective illuminance intensities in inverse proportion to their effective photocharge accumulation intervals. Accordingly, as can be seen from the FIG. 14 plot of net output signal voltage level (i.e., signal generated on OUT1 in response to binned-charge from SW1-SW4) against increasing photon flux density, the pixel output voltage exhibits a knee (reduction in slope) as each PD saturates (reaches full-well capacity) and is thus characterized by an initial slope in illuminance range R1 and three progressively reduced slopes within illuminance ranges R2, R3 and R4, respectively. In one embodiment, each of the four output signal slopes is determined during system calibration along with the pixel signal levels that mark the transition (break point) from one slope to the next. This information is then applied during pixel readout (and/or post-readout processing) to extrapolate the signal output that would have resulted absent photodiode saturation. In one implementation, for example, the digital pixel output is compared against a set of thresholds corresponding to the slope-transition points to implicate one of the four output signal ranges (one of the four illuminance ranges), followed by determination of a correction value ($\Delta_{extr}$—based on difference between the slope of the subject range and the range 1 slope, with piecewise contribution from all preceding slopes in the case of signals in range R3 or R4) to be added to the raw pixel value to yield an extrapolated pixel output value.

Still referring to FIGS. 13 and 14, in ×2-pitch and ×4-pitch pixel-size configurations (i.e., charge-binned operation), exposure-time-modulated readouts will generally yield deterministic linearization (i.e., to enable the linear extrapolation discussed above) when the incident scene content is the same for each PD in a charge-binned PD group (i.e., within a clustered 2×2 PD group in ×2-pitch readout, and within the 4×4 PDs of a pixel unit in ×4-pitch readout). Where the point spread function (PSF) of the optical system is smaller than a selectable pixel size (e.g., smaller than 2×2 PD group and/or 4×4 PD group), this per-pixel illuminance uniformity may be achieved by dynamically expanding the blur circle of the optical system to match the effective pixel size. Accordingly, in a number of embodiments, one or more optical low pass filters (e.g., one for each scaled pixel size greater than the native blur circle of the optical system) are mechanically or otherwise engaged within the optical path (e.g., behind the primary lens, but before of any micro-lens overlay) to expand the optical-system blur circle to the dimension of the selected pixel size and thus ensure that all PDs within a charge-binning group are subject to the same scene content and light level. Note that this pixel-size-selected blur-circle tailoring is optional as the high dynamic range and higher frame rate achieved by the multiple integration time charge-binning may have acceptable imaging artifacts even with an optical-system blur circle smaller than the effective pixel size.

FIG. 15 illustrates the scaled accumulation interval approach of FIG. 13 in the context of individual sub-pixels—that is, executing charge clearing operations for respective photodiodes at progressively later intervals so that the continuous (effective) charge accumulation interval is progressively shortened by a 1/n fraction of the exposure interval and thus by 6.25% in this n=16 PD example. As in FIG. 13, the accumulation-interval scaling will (where incident photon flux density remains steady throughout the exposure interval) cause each of the PDs to reach full well at a progressively later time and thus, in a ×4-pitch readout (photocharge from all 16 PDs charge-binned) yield an output signal that transitions between 16 progressively different slopes at fixed (ascertainable) illuminance intensities (i.e., as in FIG. 14 but with shortened per-slope intervals). Accordingly, the raw pixel value at any slope for which one or more PDs have saturated may be extrapolated to a precise estimate of the pixel value that would have resulted absent the PD saturation, extending the dynamic range of the image sensor.

FIG. 16 illustrates an excerpt of the FIG. 1 pixel array architecture, showing constituent elements of an exemplary color filter array (CFA) and constituent micro-lenses of a micro-lens array that may be disposed over the pixel array to implement a color-sensitive optical system. In the embodiment shown, the CFA implements a Bayer pattern (two diagonal green CFA elements sharing a center point with a diagonal red/blue pair of CFA elements) in which each CFA element overlays the photodiodes of a given 4-PD cluster—that is, a complete Bayer pattern per 16-PD pixel unit. In other embodiments, the CFA may be implemented by filter elements sized to match individual photodiodes (e.g., complete Bayer pattern per 4-PD cluster) or to match the pixel unit (uniform color filtering for all 16 PDs of the pixel unit), pass light in wavelength ranges other than red/green/blue (including infrared or other non-visible ranges), and have color patterns other than the Bayer mosaic. Similarly, individual micro-lenses may be sized to match a 4-PD cluster (or the entire 16-PD pixel unit) rather than individual photodiodes. Also, as discussed in reference to FIGS. 13 and 14 one or more low-pass optical filters may be run-time engaged to expand the blur circle of the optical system in accordance with selected (effective) pixel size (e.g., as shown at 491 for ×2-pitch pixel size, and at 493 for ×4-pitch pixel size) and thus ensure that all PDs within a charge-binning group are subject to the same scene content and light level.

FIGS. 17 and 18 illustrate alternative embodiments of the FIG. 1 pixel unit having, respectively, a single four-way shared output-node (i.e., pixel unit coupled to a single output line 501) and a pair of two-way shared output nodes (pixel unit coupled to two output lines 521, 522). In the FIG. 17 embodiment, the four read-select transistors ($123_1$-$123_4$) receive respective read-select signals (RS1, RS2, RS3, RS4) to enable of any one cluster output circuit to drive the four-way-shared output line at a given time. Thus, the ×1-pitch readout sequence shown in FIG. 2 would lack the four-way parallelism per readout and instead be implemented by 16 successive CDS readouts with respect to the 16 PDs. Ditto for the ×2-pitch readout sequence shown in FIG. 3—4 successive cluster (×2-pitch) readouts instead of four parallel cluster readouts. The dual output channel embodiment of FIG. 18 strikes a middle ground between per-cluster output line of FIG. 1 and 4-way-shared output line of FIG. 17, allowing parallelism in readouts of PDs within left and right halves of the pixel unit (the two output lines may instead be coupled respectively to top and bottom pairs of PD clusters, with corresponding rotation of the RS1/RS2 signal connections) and thus 8 successive readouts to sample all PDs in a ×1-pitch configuration and 2 successive readouts to sample all 4-PD clusters in a ×2-pitch configuration. While a source-follower amplification scheme (each output line biased by a current source) is shown in FIGS. 17 and 18, common-source or other amplification schemes may be implemented in alternative embodiments. Also, while different BIN signals (BIN1, BIN2, BIN3, BIN4) are applied to the four binning transistors, a shared control signal may be coupled to all or any subset of the binning transistors in alternative embodiments—a variant equally applicable to the FIG. 1 architecture.

FIGS. 19A-19G illustrate non-exhaustive examples of readout sequences that may be employed within the FIG. 1 pixel architecture, shading individual PDs within the 16-PD pixel unit that are read out during each stage of a given sequence. Thus, FIG. 19A illustrates a four-stage ×1-pitch readout implemented by the FIG. 2 control sequence. FIG. 19B illustrates a two-stage readout sequence in which a row-aligned pair of PDs (rather than all four PDs) are readout from each cluster in a given readout stage, alternating between those PD pairs in successive stages. FIG. 19C illustrates a PD-pair-per cluster readout similar to that in FIG. 19B, but with the PD pair being column-aligned rather than row-aligned. FIGS. 19D and 19E illustrate additional PD-pair-per-cluster readout sequences, but having non-aligned PD pairs within row-aligned clusters (FIG. 19D) and diagonally-paired PDs per cluster (FIG. 19E). FIG. 19F illustrates a readout sequence in which three PDs per cluster are read out in an initial stage to effect a perimeter PD readout with respect to the pixel unit. The remaining "interior" PD is readout from each cluster in a second stage to effect a pixel-unit-core PD readout. FIG. 19G illustrates a single-stage readout corresponding to the ×2-pitch readout sequence (all four 4-PD clusters read-out independently and concurrently) and the ×4-pitch readout sequence shown in FIGS. 3 and 4, respectively.

FIG. 20 illustrates an alternative pixel unit architecture having binary-weighted independently-switched dynamic-conversion-gain capacitances $C_U$ and $2C_U$ to enable programmatic selection of any of three added capacitances in a linear ratio (i.e., as shown in table 600) or any other practicable ratio. In a number of embodiments, for example, the programmatic selection (e.g., control value stored within a programmable register of the imaging IC) enables run-time calibration of the dynamic gain capacitance to effect a desired conversion gain distribution (e.g., as shown in FIGS. 5 and 9) and/or conversion gain minimum or maximum. In the FIG. 20 embodiment, the reset transistor 125 is coupled directly between reset node 120 and the reset voltage supply ($V_{DD}$ in this example) rather than indirectly via one of the DCG transistors—an arrangement that may also be implemented within the single-DCG-transistor embodiment of FIG. 1. Also, while two binary weighted DCG capacitances are shown (i.e., capacitance switchably coupled to node 120 by DCG2 is twice the capacitance switchably coupled to node 120 by DCG1), equal capacitances or disparate capacitances having a non-binary ratio may be implemented in alternative embodiments and may include more than two independently switched capacitances. Further, while the two capacitive elements are shown as being disposed within the same pixel unit, the individual capacitive elements (which may be more than two such elements) may be physically disposed in neighboring rows of pixel units and thus shared by those neighboring rows (i.e., to reduce per-pixel-unit MOS element count).

The various pixel-unit circuit architectures and layouts, imaging circuit architectures, color filter arrays, micro-lens arrays, readout methodology, etc. disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits and architectures. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific time intervals, transistor types, signal polarities, array dimensions, relative control pulse timing, quantities/types of photodetection elements, photo-carrier polarity, and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Programming of operational parameters (effective pixel size, applied conversion gain, charge-binning configuration, net dynamic-conversion-gain capacitance, output signal extrapolation or other processing parameters, scaled accumulation intervals, sub-pixel readout sequencing, output-signal selection thresholds, etc.) or any other configurable parameters may be achieved, for example and without limitation, by loading a control value into a register or other storage circuit within the above-described imaging IC in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit pixel array comprising:
   four sets of photodetection elements disposed in respective pixel-array regions having a shared corner;
   four readout circuits each coupled to a respective one of the four sets of photodetection elements, each of the readout circuits having:
   a floating diffusion node;
   a first transfer gate coupled between the floating diffusion node and a constituent photodetection element of the respective one of the four sets of photodetection elements; and
   an amplifier transistor having a gate terminal coupled to the floating diffusion node;
   a reset node;
   a reset transistor coupled between the reset node and a reset-voltage supply; and
   a plurality of binning transistors each coupled between the reset node and the floating diffusion node of a respective one of the readout circuits.

2. The integrated-circuit pixel array of claim 1 wherein each of the plurality of readout circuits comprises three additional transfer gates each coupled respectively between the floating diffusion node of the readout circuit and three further constituent photodetection elements within the respective one of the four sets of photodetection elements such that each of the readout circuits is coupled to a respective set of four of the photodetection elements, and wherein each set of four photodetection elements has a collective aspect ratio that nominally matches an aspect ratio of an individual photodetection element within the set of four photodetection elements.

3. The integrated-circuit pixel array of claim 2 wherein the four sets of four photodetection elements have a collective aspect ratio that nominally matches the aspect ratio of each respective set of four of the photodetection elements.

4. The integrated-circuit pixel array of claim 1 further comprising a capacitive element and a gain-control transistor coupled between the capacitive element and the reset node.

5. The integrated-circuit pixel array of claim 4 wherein the gain-control transistor is coupled between the reset node and the reset transistor such that both the reset transistor and the gain-control transistor must be rendered to a drain-to-source conducting state to charge the reset node via the reset-voltage supply.

6. An integrated-circuit image sensor comprising the integrated-circuit pixel array of claim 4 and further comprising a control signal generator to:
  assert first, second and third transfer-gate pulses at a gate terminal of the first transfer gate during successive first, second and third phases, respectively, of a multi-phase readout operation, each of the first, second and third transfer-gate pulses to enable photocharge transfer from the one of the photodetection elements to the floating diffusion node;
  maintain the binning transistors and the gain-control transistor in a non-conducting state during the first phase of the multi-phase readout operation to implement a first conversion gain for the photocharge transfer enabled by the first transfer-gate pulse;
  switch at least one of the binning transistors to a conducting state and maintaining the gain-control transistor in the non-conducting state during the second phase of the multi-phase readout operation to implement a second conversion gain for the photocharge transfer enabled by the second transfer-gate pulse, the second conversion gain being lower than the first conversion gain; and
  switch the gain-control signal to the conducing state while the at least one of the binning transistors is in the conducting state during the third phase of the multi-phase readout operation to implement a third conversion gain for the photocharge transfer enabled by the third transfer-gate pulse, the third conversion gain being lower than the second conversion gain.

7. An integrated-circuit image sensor comprising the integrated-circuit pixel array of claim 1 and further comprising a control signal generator to:
  assert first and second transfer-gate pulses at a gate terminal of the first transfer gate during successive first and second phases, respectively, of a multi-phase readout operation, each of the first and second transfer-gate pulses to enable photocharge transfer from the one of the photodetection elements to the floating diffusion node;
  maintain the binning transistors in a non-conducting state during the first phase of the multi-phase readout operation to implement a first conversion gain for the photocharge transfer enabled by the first transfer-gate pulse; and
  switch at least one of the binning transistors to a conducting state during the second phase of the multi-phase readout operation to implement a second conversion gain for the photocharge transfer enabled by the second transfer-gate pulse, the second conversion gain being lower than the first conversion gain.

8. The integrated-circuit image sensor of claim 7 wherein the control signal generator additionally asserts, during each of first and second reset intervals that precede the first and second phases of the multi-phase readout operation, a control pulse on the reset transistor and a control pulse on at least one of the binning transistors to couple the reset-voltage supply to the floating diffusion node of at least one of the readout circuits.

9. The integrated-circuit image sensor of claim 7 wherein the control signal generator outputs control signals to reset constituent photodetection elements of each of the sets of photodetection elements at time-staggered offsets within an exposure interval.

10. An integrated-circuit image sensor comprising the integrated-circuit pixel array of claim 1 and further comprising a color filter array having respective color filter elements disposed over the four sets of the photodetection elements and organized in a mosaic color pattern.

11. The integrated-circuit image sensor of claim 10 further comprising a micro-lens array having a respective micro-lens element disposed each constituent photodetection element of each of the sets of photodetection elements.

12. The integrated-circuit pixel array of claim 1 wherein two of the four readout circuits are coupled in common to a first output line, and another two of the four readout circuits are coupled in common to a second output line.

13. The integrated-circuit pixel array of claim 1 further comprising a first transistor and wherein at least two of the binning transistors are coupled to the reset node via the first transistor.

14. A method of operation within an integrated-circuit pixel array having four sets of photodetection elements disposed in respective pixel-array regions having a shared corner, a reset node, four floating diffusion nodes, four readout circuits coupled respectively to the four floating diffusion nodes, and four binning transistors coupled between the reset node and respective ones of the four floating diffusion nodes, the method comprising:
  switching a reset transistor to a conducting state throughout a reset interval to couple the reset node to a reset-voltage supply; and
  switching the binning transistors to conducting states during the reset interval to couple the respective floating diffusion nodes to the reset node such that each of the floating diffusion nodes is charged to a reset potential by the reset-voltage supply.

15. The method of claim 14 further comprising generating, via one of the readout circuits, a first output signal corresponding to the reset potential of the respective floating diffusion node, and wherein generating the first output signal comprises switching the binning transistors to a non-conducting state and generating the first output signal while the binning transistors remain in the non-conducting state.

16. The method of claim 15 wherein generating the first output signal comprises generating the first output signal while the binning transistors remain in the conducting state, the method further comprising switching the binning transistors to a non-conducting state and generating a second output signal while the binning transistors remain in the non-conducting state.

17. The method of claim 16 wherein generating the first output signal comprises generating the first output signal during a first reset-state sampling interval and generating the second output signal comprises generating the second output signal during a second reset-state sampling interval that transpires after the first reset-state sampling interval, the method further comprising maintaining the reset transistor in a non-conducting state and from commencement of the first reset-state sampling interval to conclusion of the second reset-state sampling interval.

18. The method of claim 14 wherein the four floating diffusion nodes are coupled respectively to the four sets of photodetection elements via respective sets of four transfer gates, the method further comprising, after the reset interval transpires, switching a nonzero predetermined number of transfer gates within each of the sets of four transfer gates to a conducting state to enable photocharge transfer from a corresponding nonzero predetermined number of the photodetection elements within each of the four sets of the photodetection elements to the respective floating diffusion node.

19. The method of claim 18 further comprising storing a pixel-size value within a programmed register, the pixel-size value indicating the nonzero predetermined number of the transfer gates.

20. The method of claim 19 wherein switching the predetermined number of transfer gates to the conducting state to enable photocharge transfer comprises switching the one or more of the transfer gates to the conducting state during a charge transfer interval, the method further comprising selectively switching a predetermined number the binning transistors to the conducting state during the charge transfer interval, wherein the predetermined number of the binning transistors is indicated by the pixel-size value and ranges from zero to the total number of the binning transistors.

21. The method of claim 20 wherein switching the predetermined number the binning transistors to the conducting state during the charge transfer interval comprises switching at least one of the binning transistors to the conducting state during the charge transfer interval, and wherein the integrated-circuit pixel array comprises a capacitive element and a gain-control transistor coupled between the capacitive element and the reset node, the method further comprising switching the gain-control transistor to a conducting state throughout charge transfer interval to reduce a conversion gain of the photocharge transfer by coupling the capacitive element to at least one of the floating diffusion nodes via the reset node and the at least one of the binning transistors.

22. The method of claim 14 wherein the integrated-circuit pixel array comprises a gain-control transistor coupled between the reset transistor and the reset node, the method further comprising switching the gain-control transistor to a conducting state throughout the reset interval to couple the reset-voltage supply to the reset node via the reset transistor and the gain-control transistor.

23. An integrated-circuit image sensor comprising:
a pixel array having four sets of photodetection elements disposed in respective pixel-array regions having a common corner, a reset node, a reset transistor, four floating diffusion nodes, four readout circuits coupled respectively to the floating diffusion nodes, and four binning transistors coupled between the reset node and respective ones of the four floating diffusion nodes; and
control circuitry to:
switch the reset transistor to a conducting state throughout a reset interval to couple the reset node to a reset-voltage supply;
switch the four binning transistors to conducting states during the reset interval to couple the respective floating diffusion nodes to the reset node such that each of the four floating diffusion nodes is charged to a reset potential by the reset-voltage supply.

24. The integrated-circuit image sensor of claim 23 wherein each of the floating diffusion nodes is coupled to a respective one of the sets of photodetection elements via a respective one of four sets of transfer gates, and wherein, after the reset interval transpires, the control circuitry switches a nonzero predetermined number of transfer gates within each of the four sets of transfer gates to a conducting state to enable photocharge transfer from a corresponding nonzero predetermined number of the photodetection elements within each of the four sets of photodetection elements to the floating diffusion node coupled to the subset of the photodetection elements.

25. The integrated-circuit image sensor of claim 24 further comprising a programmable register to store a pixel-size value that indicates the nonzero predetermined number.

26. The integrated-circuit image sensor of claim 25 wherein the control circuitry to switch the predetermined number of transfer gates to the conducting state comprises circuitry to:
switch the one or more of the transfer gates within each of the four sets of transfer gates to the conducting state during a charge transfer interval; and
switch a predetermined number the binning transistors to the conducting state during the charge transfer interval, wherein the predetermined number of the binning transistors is indicated by the pixel-size value and ranges from zero to the total number of the binning transistors.

* * * * *